(12) United States Patent
Okawa et al.

(10) Patent No.: US 6,926,797 B2
(45) Date of Patent: Aug. 9, 2005

(54) ELECTRONIC PART FEEDER

(75) Inventors: Koji Okawa, Yamanashi (JP); Shuuichi Kubota, Yamanashi (JP); Takao Kashiwazaki, Yamanashi (JP); Tadashi Endo, Yamanashi (JP); Satoshi Kawaguchi, Kofu (JP); Shiro Oji, Osaka (JP); Masato Tanino, Kofu (JP); Hirofumi Obara, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/380,707

(22) PCT Filed: Sep. 17, 2001

(86) PCT No.: PCT/JP01/08031
§ 371 (c)(1),
(2), (4) Date: Mar. 17, 2003

(87) PCT Pub. No.: WO02/23969
PCT Pub. Date: Mar. 21, 2002

(65) Prior Publication Data
US 2003/0183347 A1 Oct. 2, 2003

(30) Foreign Application Priority Data
Sep. 18, 2000 (JP) .................................... 2000-281924
Nov. 22, 2000 (JP) .................................... 2000-356229
Sep. 13, 2001 (JP) .................................... 2000-278190

(51) Int. Cl.[7] .......................... B32B 35/00; B65H 5/28
(52) U.S. Cl. ........................ 156/344; 156/584; 221/25; 221/72; 221/87; 414/411; 414/416
(58) Field of Search .................... 156/344, 584; 221/25, 72, 73, 79, 87; 226/120, 139; 414/411, 416, 425

(56) References Cited

U.S. PATENT DOCUMENTS

| | | | | |
|---|---|---|---|---|
| 4,606,194 A | * | 8/1986 | Pirtle et al. | 62/6 |
| 4,923,089 A | * | 5/1990 | Hineno et al. | 221/1 |
| 5,024,720 A | * | 6/1991 | Boss et al. | 156/584 |
| 5,213,653 A | * | 5/1993 | Akahori et al. | 156/584 |
| 5,515,600 A | * | 5/1996 | Iwasaki et al. | 29/740 |
| 5,839,637 A | * | 11/1998 | Kanai | 226/128 |
| 6,032,845 A | * | 3/2000 | Piccone et al. | 226/139 |
| 6,077,022 A | * | 6/2000 | Gfeller et al. | 414/416.01 |
| 6,652,706 B1 | * | 11/2003 | MacNeil et al. | 156/344 |
| 2003/0219330 A1 | * | 11/2003 | Lyndaker et al. | 414/411 |

FOREIGN PATENT DOCUMENTS

| JP | 3-243563 | 10/1991 |
|---|---|---|
| JP | 9-172295 | 6/1997 |
| JP | 9-252193 | 9/1997 |
| JP | 10-145083 | 5/1998 |
| JP | 11-171378 | 6/1999 |
| JP | 2000-114778 | 4/2000 |

* cited by examiner

*Primary Examiner*—Mark A. Osele
(74) *Attorney, Agent, or Firm*—Wenderoth, Lind & Ponack, L.L.P.

(57) ABSTRACT

In an electronic component feeding apparatus for feeding components with use of a taping component, a brushless motor is used as a drive motor in a tape sending mechanism that transports the taping component so as to improve productivity in an electronic component mounting apparatus equipped with the electronic component feeding apparatus. Also, an electronic component feeding apparatus is provided with a control part that automatically executes initial processing such as sending of the taping component, as well as detects and reports a sending failure of the taping component when the electronic component feeding apparatus is installed in the electronic component mounting apparatus, which makes it possible to provide an electronic component feeding apparatus enabling easy and prompt detection of the sending failure of the taping component.

15 Claims, 24 Drawing Sheets

A-A

A-A

ELECTRONIC PART FEEDER

This application is a National Stage application of PCT/JP01/08031, filed Sep. 17, 2001.

TECHNICAL FIELD

The present invention relates to an electronic component feeding apparatus for feeding electronic components to specified positions in a state of being installed in an electronic component mounting apparatus for mounting chip-type electronic components onto printed boards. More particularly, the present invention relates to improvement of an electronic component feeding apparatus for feeding components with use of a taping component composed of a carrier tape, incorporating electronic components in upper-side recess portions, and a cover tape attached thereto for covering the recess portions, for improving productivity of an electronic component mounting apparatus equipped with the electronic component feeding apparatus.

BACKGROUND ART

With recent tendency toward manufacturing cost saving and labor saving in electronics products, electronic component mounting apparatuses for mounting chip-type electronic components onto printed circuits used in electronics products are being vigorously developed.

In such an electronic component mounting apparatus, as a device for feeding electronic components to specified positions for mounting, there has been developed an electronic component feeding apparatus for feeding components with use of a taping component composed of a carrier tape, that incorporates electronic components in upper-side recess portions, and a cover tape attached thereto for covering the recess portions.

FIG. 19 is a view showing a conventional example of such electronic component feeding apparatus. As shown in this drawing, an electronic component feeding apparatus 501 shown herein comprises: an apparatus mainframe 505 for providing a transportation route of a taping component 3; a component housing reel 7 provided on one end of the apparatus mainframe 505; a tape sending mechanism 509 for intermittently sending off taping component 3 pulled out from the component housing reel 7 by a specified length along the transportation route on the apparatus mainframe 505; a cover stripping-off mechanism 515 for stripping off a cover tape 11 from a carrier tape 13 of the taping component 3 sent off by the tape sending mechanism 509 at a specified position on the transportation route of the taping component 3; a cover collecting mechanism 517 for serially taking up and collecting the cover tape 11 stripped off by the cover stripping-off mechanism 515; and a shutter 527 having a component pickup port 527a for picking up an electronic component 19 (see FIG. 20) on the carrier tape 13 exposed through stripping-off of the cover tape 11. The electronic component feeding apparatus 501 is installed in an electronic component mounting apparatus such that electronic components 19 on the carrier tape 13 exposed through stripping-off of the cover tape 11 are serially passed through a component pickup position 21 of the electronic component mounting apparatus.

The electronic component mounting apparatus is provided with a suction nozzle 23 for sucking the electronic component 19 by vacuum suction force in the component pickup position 21, and the electronic component 19 sucked by the suction nozzle 23 is sequentially transferred and mounted onto a printed board positioned in a specified position.

As shown in FIG. 20, the taping component 3 is structured such that on an upper face the carrier tape 13 incorporates chip-type electronic components 19 in upper-side recess portions 13a, and the cover tape 11 for covering the recess portions 13a is attached in a detachable manner. The carrier tape 13 is set to have a width larger than the cover tape 11, and on one side edge of the carrier tape 13 on which the cover tape 11 is not attached, engagement holes 13b for engaging with engagement hooks 529a of a wheel 529 of the tape sending mechanism 509 are provided along a longitudinal direction of the tape at constant pitches. The taping component 3 is housed in a state of being rolled onto the component housing reel 7 supported by the apparatus mainframe 505 rotatably about a reel axis (central axis).

The tape sending mechanism 509 has the wheel 529 disposed on a lower front side of a shutter 527 provided on a forward end side of the transportation route, that rotates by synchronizing with reciprocal movement of the shutter 527. As shown in FIG. 21, engagement hooks 529a for engaging with the engagement holes 13b of the taping component 3 are provided on an outer circumferential portion of the wheel 529 at constant pitches for intermittent constant-amount sending and positioning of the taping component 3. Also, the tape sending mechanism 509 is equipped with a drive motor 510, which rotates the wheel 529.

The shutter 527 is reciprocatably mounted on the apparatus mainframe 505 in a state of pressing an upper face of the cover tape 11 short of the component pickup position 21. As shown in FIG. 22, the shutter 527 comprises of a cover pressing member 527b for pressing the upper face of the cover tape 11, a cover pulling-out port 527c for pulling out the cover tape 11 stripped off from the carrier tape 13, a carrier pressing member 527d for pressing the upper face of the carrier tape 13 with the cover tape 11 stripped off, and a component pickup port 527a for the suction nozzle 23 to pick up electronic component 19 from the carrier tape 13.

In the cover stripping-off mechanism 515, the cover tape 11 is stripped off from the carrier tape 13 by a reciprocating operation of the shutter 527 which interlocks with a sending operation of the taping component 3 by the tape sending mechanism 509, a take-up torque imparted by the cover collecting mechanism 517 to the cover tape 11 and the like.

A dead cover tape 11 is collected by the cover collecting mechanism 517 placed on top of the apparatus. The cover collecting mechanism 517 collects the stripped-off dead cover tape 11 by winding it up onto a cover take-up reel 530 rotated by a drive motor 531.

Further, in order to prevent the electronic component 19 from failing from the component pickup port 527a of the shutter 527 when the electronic component feeding apparatus 501 is moved in a state of being dismounted from the electronic component mounting apparatus, an unshown cover is placed on the component pickup port 527a so as to put the component pickup port 527a in a closed state when the electronic component feeding apparatus 501 is moved.

Also, in such electronic component feeding apparatus 501, the drive motor 510 in the tape sending mechanism 509 and the drive motor 531 in the cover collecting mechanism 517 require maintenance according to frequency of use of the electronic component feeding apparatus 501, and therefore there may be a case, for example, that each drive motor is replaced. Operational procedures in a case of replacing the drive motor 510 in the tape sending mechanism 509 as an example of the above case will be described below.

First, description will be given of a relationship between the drive motor 510 and the wheel 529 in the tape sending mechanism 509. As shown in FIG. 23, in the tape sending mechanism 509, the drive motor 510 is fixed to a frame 553, and a slit plate for sensor 551 for a rotational speed measuring sensor 564 for measuring a rotational speed of the drive motor 510 is fixed to a rotational axis part 510a of the drive motor 510. The slit plate for sensor 551 is rotated in the drive motor 510 such that a peripheral portion of the slit plate for sensor 551 can pass inside a slit portion of the rotational speed measuring sensor 564 without making any contact therewith. Also, to the wheel 529, there is fixed a worm wheel 560 so as to have the same center of rotation. Since a worm 561 to be engaged with the worm wheel 560 is fixed to an axis part 562, rotating the axis part 562 about its axis rotates the worm 561, and thereby rotates the worm wheel 560 engaged with the worm 561, resulting in rotation of the wheel 529. Also, to a top end portion of the axis part 562 on the left side of FIG. 23, there is fixed a gear part 563. A gear part 510b, formed on a top end of the rotational axis part 510a of the drive motor 510, and the gear part 563 are engaged with each other. This enables rotational operation of the wheel 529 by the drive motor 510.

Next, description will be given of dismounting procedures of the drive motor 510. As shown in FIG. 23, by loosening a screw and the like, the tape sending mechanism 509 is dismounted as a unit from the apparatus mainframe 505. Then, in the tape sending mechanism 509 as shown in FIG. 24, for measuring rotational speed of the drive motor 510, a fixing screw 552 for fixing the slit plate for sensor 551, fixed to the rotational axis part 510a of the drive motor 510, to the rotational axis part 510a of the drive motor 510 is loosened, and a fixing screw 554 for fixing the drive motor 510 to the frame 553 of the tape sending mechanism 509 is unscrewed, so that the drive motor 510 is extracted from the frame 553.

Next, in a case of mounting a new drive motor 510 on the tape sending mechanism 509, mounting is performed in reverse order of the dismounting procedures of the drive motor 510. After the drive motor 510 is mounted on the frame 553 of the tape sending mechanism 509 such that the gear part 510b of the drive motor 510 engages with the gear part 563, the tape sending mechanism 509 is mounted on the apparatus mainframe 505. After that, as shown in FIG. 25, a center of a mounting reference position of the wheel 529 in the tape sending mechanism 509 is aligned with a center of a mounting reference position of the apparatus mainframe 505. Then, as shown in FIG. 26, a mounting position of the slit plate for sensor 551 is adjusted so that a peripheral portion of the slit plate for sensor 551 can pass inside the slit portion of the rotational speed measuring sensor 564 without making any contact therewith, by which a replacement operation of the drive motor 510 in the tape sending mechanism 509 is completed.

However, in the above-structured electronic component feeding apparatus 501, when the striped-off cover tape 11 is taken up onto the cover take-up reel 530 by the cover take-up reel 530 rotated by the drive motor 531 in the cover collecting mechanism 517, a take-up diameter of the cover tape 11 in the cover take-up reel 530 is changed corresponding to a take-up amount of the cover tape 11, which fluctuates a load on the drive motor 531. If a take-up amount increases, a load on the drive motor 531 increases, which causes such an issue as shortened life of the drive motor 531, increased frequency of motor replacement, deteriorated maintainability in the electronic component feeding apparatus, and degraded productivity in the electronic component mounting apparatus equipped with the electronic component feeding apparatus.

Further, as the drive motor 510 for driving the wheel 529 that sends off the taping component 3 by a constant amount in the tape sending mechanism 509, and as the drive motor 531 for driving the cover take-up reel 530 that takes up the stripped-off cover tape 11 in the cover collecting mechanism 517, DC motors (with brushes) and stepping motors are used. In such motors, for example, a brush is in contact with a rotational axis in the motor, and therefore replacement is necessary because of wear of this contact portion. For example, in a DC motor operating time is approximately 100 to 500 hours, and in a stepping motor operating time is approximately 2000 to 5000 hours. Consequently, a life of the motor is short and motor replacement frequency is increased, which causes such issues as further deteriorated maintainability in the electronic component feeding apparatus, and degraded productivity in the electronic component mounting apparatus equipped with the electronic component feeding apparatus.

Further, in a case of conducting replacement operation of each drive motor in the electronic component feeding apparatus, as with a case of replacing a drive motor 10 in a tape sending mechanism 9 for example, dismounting and mounting of a plurality of components are necessary, and after mounting of each component, a mounting position of each of the components needs to be adjusted, which requires a large amount of time and labor and causes such issues as considerable deterioration of maintainability of the electronic component feeding apparatus, and degraded productivity in the electronic component mounting apparatus equipped with the electronic component feeding apparatus as replacement frequency of the drive motor increases.

Also, corresponding to a width of the electronic component 19 to be incorporated, a width of the carrier tape and the cover tape of the taping component 3 is changed and set. Accordingly, in order to accept multiple kinds of taping components different in width of the cover tape 11, multiple kinds of cover take-up reels 530 and the like corresponding to respective tape widths, for use in the cover collecting mechanism 517, are prepared in a conventional electronic component feeding apparatus. This kind of diversification of size of cover-tape collecting components leads to increased apparatus costs, and causes such issues as increased mounting costs of electronic components and degraded productivity in the electronic component mounting apparatus equipped with the electronic component feeding apparatus.

In the conventional electronic component feeding apparatus, as shown in FIG. 19, dead cover tape 11 is collected by being taken up onto the cover take-up reel 530 placed on top of the apparatus. Further, dead carrier tape 13 is collected by being transported from a top end of the apparatus anterior to the tape sending mechanism 509 to an exterior of the apparatus.

However, in the constitution of separately collecting the cover tape 11 and the carrier tape 13 as shown above, a number of component parts is increased due to collection facilities for each of the tapes, which causes such issues as increased apparatus costs, increased costs of mounting electronic components in the electronic component mounting apparatus equipped with the electronic component feeding apparatus, and degraded productivity.

Also, for increasing productivity, a mounting line of electronic components and the like is often structured such that a plurality of electronic component mounting apparatuses are adjacently disposed in parallel so that a plurality of electronic component mounting apparatuses are simultaneously operated. In the conventional electronic component feeding apparatus, a mounting position of the component housing reel 7 is fixedly set to a specified position on the apparatus mainframe. Consequently, a position of the component housing reel 7 in each adjacent electronic component feeding apparatus is aligned, and thus a replacement operation of the component housing reel 7 is disturbed by the component housing reels 7 of other adjacent electronic component feeding apparatuses.

Accordingly, in the past when replacement of the taping component is necessary in some of the electronic component feeding apparatuses, a plurality of the electronic component mounting apparatus adjacently disposed in parallel are all temporarily stopped, and replacement of necessary taping components is conducted in order from an end. However, this reduces a continuous run length of the electronic component mounting apparatus, thereby causing such an issue as degradation of an effect of increasing productivity.

Further as described before, a mounting line of electronic components and the like is often structured such that a plurality of electronic component mounting apparatuses are adjacently disposed in parallel and a plurality of the electronic component mounting apparatuses are simultaneously operated. When replacement of the electronic component feeding apparatus in each electronic component mounting apparatus for change of mounted electronic components and the like becomes necessary, an opportunity of transferring the electronic component feeding apparatus is generated. Accordingly, in a state where the electronic component feeding apparatus is not installed in the electronic component mounting apparatus, the shutter 527 is provided with a cover (illustration omitted) corresponding to the size of the component pickup port 527a for closing the component pickup port 527a in order to prevent an electronic component from falling from the component pickup port 527a during transfer of the electronic component feeding apparatus.

However, in the conventional electronic component feeding apparatus, various kinds of covers are prepared corresponding to tape width or a size of the electronic component 19, and a cover with an optimum size conforming to the tape width or the size of the electronic component 19 is selected for replacement where necessary. This diversification of the cover also causes increased apparatus costs, as well as degraded productivity of the electronic component mounting apparatus equipped with the electronic component feeding apparatus.

Next, another example of the conventional electronic component feeding apparatus is shown in FIG. 27 and FIG. 28. FIG. 27 is a fragmentary side view showing an electronic component feeding apparatus that operates without power feeding, and FIG. 28 is a fragmentary side view showing an electronic component feeding apparatus that operates with power feeding.

The electronic component feeding apparatus 601 shown in FIG. 27 comprises, as shown in this drawing: an apparatus mainframe 605 for providing a transportation route of a taping component 3; a component housing reel 7 provided on one end of the apparatus mainframe 605; a tape sending mechanism 609 for intermittently sending off a taping component 3 pulled out from the component housing reel 7 by a specified length along a specified transportation route on the apparatus mainframe 605; a cover stripping-off mechanism 615 for stripping off a cover tape 11 from a carrier tape 13 of the taping component 3 sent off by the tape sending mechanism 609 in a specified position on the transportation route of the taping component 3; and a cover take-up mechanism 617 for serially taking up the cover tape 11 stripped off by the cover stripping-off mechanism 615.

The electronic component feeding apparatus 601 is installed in an electronic component mounting apparatus such that electronic components 19 on the carrier tape 13 exposed through stripping-off of the cover tape 11 are serially passed through a component pickup position 21 of the electronic component mounting apparatus.

The electronic component mounting apparatus is provided with a suction nozzle 23 for sucking electronic component 19 by vacuum suction force at the component pickup position 21, and the electronic component 19 sucked by the suction nozzle 23 is sequentially transferred and mounted onto a printed board positioned in a specified position.

As shown in FIG. 29, the taping component 3 is structured such that on an upper-side face of a carrier tape 13, which incorporates chip-type electronic components 19 in upper-side recess portions 13a, a cover tape 11 for covering the recess portions 13a is attached in a detachable manner. The carrier tape 13 is set to have a width larger than the cover tape 11, and on one side edge of the carrier tape 13 on which the cover tape 11 is not attached, engagement holes 13b used by the tape sending mechanism 609 for sending and positioning of the tape are provided along a longitudinal direction of the tape at constant pitches.

The taping component 3 is rolled onto the component housing reel 7 that is rotatably supported by the apparatus mainframe 605.

The tape sending mechanism 609 has a link 628 for converting reciprocal movement of an operation lever 626, serving as an operating device, to reciprocal movement of a shutter 627 on a forward end of the transportation route, and a wheel 629 disposed on a lower front side of the shutter 627 that rotates by synchronizing with the reciprocal movement of the shutter 627. As shown in FIG. 30, engagement hooks 629a engaging with the engagement holes 13b of the taping component 3 are provided on an outer circumferential portion of the wheel 629 at constant pitches for intermittent constant-amount sending and positioning of the taping component 3.

The operation lever 626 is a swinging lever having a rotational axis concentric with a central axis of a cover take-up reel 630, and the reciprocal movement of the operation lever 626 is composed of a pressing operation by external force shown with arrow-C in FIG. 27 and a return operation in an opposite direction to that of arrow-C obtained when the external force is removed.

The shutter 627 is reciprocatably mounted on the apparatus mainframe 605 in a state of pressing an upper face of the cover tape 11 in the vicinity before the component pickup position 21. As shown in FIG. 31, the shutter 627 comprises a cover pressing part 627b for pressing the upper face of the cover tape 11, a cover pulling-out port 627c for pulling out the cover tape 11 stripped off from the carrier tape 13, a carrier pressing part 627d for pressing an upper face of the carrier tape 13 with the cover tape 11 stripped off, and a component pickup port 627a for suction nozzle 23 to pick up electronic component 19 from the carrier tape 13. The shutter 627 reciprocally moves in unison with the reciprocal movement of the operation lever 626. At a time of a pressing operation of the operation lever 626, the shutter 627 reciprocally moves a direction of arrow-D shown in FIG. 31, whereas at a time of a return operation of the operation lever 626, the shutter returns in an opposite direction to that of arrow-D.

The cover take-up mechanism 617 comprises a take-up reel 630 for taking up cover tape 11 stripped off from the carrier tape 13, a take-up lever integrally placed on the operation lever 626, a take-up spring for pressing the take-up lever to a take-up direction of the take-up reel 630, and a one-way clutch for linking a rotational axis of the take-up lever and a rotational axis of the take-up reel 630 only when the take-up lever rotates in a take-up direction of the take-up reel 630.

In the cover stripping-off mechanism 615, the cover tape 11 is stripped off from the carrier tape 13 by the reciprocal movement of the shutter 627, which interlocks with a sending operation of the taping component 3 by the tape sending mechanism 609, a take-up torque imparted by the cover take-up mechanism 617 to the cover tape 11 and the like.

Next, an electronic component feeding apparatus 701 shown in FIG. 28 is structured to be operated by power feeding with the operation lever 626 shown in FIG. 27 being omitted, and the constitution thereof is almost identical to that of FIG. 27 except for the driving structure. Therefore, description of the constitution identical to the electronic component feeding apparatus 601 shown in FIG. 27 is omitted, and only the constitution different therefrom will be described below.

The electronic component feeding apparatus 701 is rotated by a tape sending mechanism 709 being driven by a motor and sends off taping component 3. In synchronization with the tape sending mechanism 709, a cover take-up mechanism 717 also rotates.

The taping component 3 is housed in a state of being rolled onto component housing reel 7 supported by an apparatus mainframe 705 rotatably about a reel axis 7a.

The cover take-up mechanism 717 comprises a take-up reel 730 for taking up cover tape 11 stripped off from carrier tape 13, a take-up lever 732 linked to the take-up reel 730, a take-up spring 734 for pressing the take-up lever 732 to a take-up direction of the take-up reel 730, and a one-way clutch for linking a rotational axis of the take-up lever 732 and a rotational axis of the take-up reel 730 only when the take-up lever 732 rotates in the take-up direction of the take-up reel 730.

However, in a case of the electronic component feeding apparatus 601 that operates without power feeding shown in FIG. 27, the tape sending mechanism 609 is structured such that a position of engagement of the engagement holes 13b of the taping component 3 by the engagement hooks 629a of the wheel 629 determines accuracy of a stop position of the wheel 629. This necessitates slight mechanical adjustment of the component pickup position 21 of the suction nozzle 23 in the electronic component mounting apparatus. For example, one reciprocating operation of the operation lever 626 determines a reference sending amount of the taping component 3, more particularly the sending amount is determined by reference sending amount×number of times. Since a sendable amount is only an integer multiple of the reference sending amount, if a necessary sending amount is not an integer multiple of the reference sending amount, it is necessary to perform such mechanical adjustment as changing a ratio of the reciprocating operation of the operation lever 626 by the link 628 to the rotational amount of the wheel 629 for changing the reference sending amount itself. However, if a sending amount needs to be changed due to replacement of the taping component 3 with a component of other kinds and the like, it is necessary to disassemble parts of the electronic component feeding apparatus 601 and perform the above-stated mechanical adjustment of the component pickup position 21, which disturbs easy changing of the component pickup position 21.

Further, in a case of the electronic component feeding apparatus 701 that operates with power feeding shown in FIG. 28, even if some trouble is already present at a point of installing the electronic component feeding apparatus 701 in the electronic component mounting apparatus, an operator can recognize the trouble of the electronic component feeding apparatus 701 only after the trouble occurs when the electronic component mounting apparatus is operated. If there is a sending failure of the taping component 3 or a shortage of the taping component 3 in the electronic component feeding apparatus, sending of the taping component 3 or winding of the cover tape 11 are not normally executed when the electronic component mounting apparatus is operated. It is not until this failure is notified by virtue of a lamp or a buzzer provided on the electronic component mounting apparatus side that an operator of the electronic component mounting apparatus recognizes the failure based on this notification, and therefore the operator tentatively stops the electronic component mounting apparatus for correcting a suction position 1g (component pickup position) of the taping component 3 or for replacing the taping component 3.

Therefore, in terms of ensuring sending of the taping component 3 in the electronic component mounting apparatus equipped with the electronic component feeding apparatus, the above-described conventional constitution has such issues as deteriorated usability of the electronic component mounting apparatus and decreased operating ratio of the electronic component mounting apparatus, as well as degraded productivity of the electronic component mounting apparatus.

Accordingly, for solving the above issues, it is an object of the present invention to provide an electronic component feeding apparatus for feeding electronic components in a state of being installed in an electronic component mounting apparatus, whose productivity in the electronic component mounting apparatus is increased by improvement of maintainability and usability and by reduction of manufacturing costs.

SUMMARY OF THE INVENTION

In order to achieve the above object, the present invention has the following constitutions.

According to a first aspect of the present invention, there is provided an electronic component feeding apparatus comprising:

a tape sending mechanism for pulling out a taping component composed of a carrier tape, for incorporating electronic components in upper-side recess portions, and a cover tape attached thereto for covering the recess portions, and sending the taping component along its transportation route;

a cover stripping-off mechanism for stripping the cover tape from the carrier tape of the taping component sent by the tape sending mechanism along the transportation route of the taping component; and a cover collecting mechanism for serially sending stripped-off cover tape in a collectable manner to a collection position, wherein the tape sending mechanism has a first rotary member for sending off the taping component by being rotated along the taping component, and a first drive motor for rotating the first rotary member, with a brushless motor being used as the first drive motor, wherein the cover collecting mechanism has a second rotary member for sending off the cover tape by being rotated along the cover tape, and a second drive motor for rotating the second rotary member, and wherein the electronic components in the recess portions exposed by stripping-off of the cover tape are sequentially fed to a component pickup position of an electronic component mounting apparatus.

According to a second aspect of the present invention, there is provided the electronic component feeding apparatus as defined in the first aspect, wherein a brushless motor is used as the second drive motor in the cover collecting mechanism.

According to a third aspect of the present invention, there is provided the electronic component feeding apparatus as defined in the first or second aspect, wherein in the cover collecting mechanism, the first rotary member and the second rotary member are disposed such that a central axial direction of rotation of the second rotary member in the cover collecting mechanism is approximately orthogonal to a central axial direction of rotation of the first rotary member in the tape sending mechanism.

According to a fourth aspect of the present invention, there is provided an electronic component feeding apparatus comprising:

a tape sending mechanism for pulling out a taping component that is composed of a carrier tape, for incorporating electronic components in upper-side recess portions, and a cover tape attached thereto for covering the recess portions, from a component housing reel onto which the taping component is wound, and sending the taping component along its transportation route;

a cover stripping-off mechanism for stripping the cover tape from the carrier tape of the taping component sent by the tape sending mechanism along the transportation route of the taping component; and a cover collecting mechanism for serially sending stripped-off cover tape to a collection position and collecting the stripped-off cover tape, wherein the cover collecting mechanism has a twist transportation mechanism for twisting and transporting the stripped-off cover tape so that a face of the cover tape is parallel to a face approximately orthogonal to an axial direction of the component housing reel, and a brushless motor is used as a second drive motor in the twist transportation mechanism, and wherein the electronic components in the recess portions exposed by stripping-off of the cover tape are sequentially fed to a component pickup position of an electronic component mounting apparatus.

According to a fifth aspect of the present invention, there is provided the electronic component feeding apparatus as defined in the first aspect, wherein the tape sending mechanism has a component housing reel onto which the taping component is wound and from which the taping component is pulled, the cover collecting mechanism has a twist transportation mechanism for twisting and transporting the stripped-off cover tape so that a face of the cover tape is parallel to a face approximately orthogonal to an axial direction of the component housing reel, and the twist transportation mechanism has the second drive motor for rotating the second rotary member, with a brushless motor being used as the second drive motor.

According to a sixth aspect of the present invention, there is provided the electronic component feeding apparatus as defined in the fourth or fifth aspect, wherein the twist transportation mechanism includes a second rotary member for sending off the cover tape by being rotated along the cover tape, and a length of the second rotary member in its axial direction is set larger than a maximum value of a width of the cover tape, and the axial direction of the second rotary member is approximately parallel to a sending direction of the taping component toward the component pickup position.

According to a seventh aspect of the present invention, there is provided an electronic component feeding apparatus installed in an electronic component mounting apparatus, comprising:

a tape sending mechanism for pulling out a taping component composed of a carrier tape, for incorporating electronic components in upper-side recess portions, and a cover tape attached thereto for covering the recess portions, and sending the taping component along its transportation route;

a cover stripping-off mechanism for stripping the cover tape from the carrier tape of the taping component sent by the tape sending mechanism along the transportation route of the taping component;

a carrier collecting mechanism for leading stripped-off carrier tape to a single tape discharge port provided for tape collection in a collection position of a mainframe of the electronic component feeding apparatus equipped with the tape sending mechanism and the cover stripping-off mechanism, and collectably discharging the stripped-off carrier tape from the tape discharge port; and a cover collecting mechanism for leading the stripped-off cover tape to the tape discharge port and collectably discharging the stripped-off cover tape from the tape discharge port, wherein the electronic components in the recess portions exposed by stripping-off of the cover tape sequentially pass through a component pickup position of the electronic component mounting apparatus.

According to an eighth aspect of the present invention, there is provided the electronic component feeding apparatus as defined in the first aspect, further comprising:

a carrier collecting mechanism for leading the stripped-off carrier tape to a single tape discharge port provided for tape collection in a collection position of a mainframe of the electronic component feeding apparatus equipped with the tape sending mechanism and the cover stripping-off mechanism, and collectably discharging the stripped-off carrier tape from the tape discharge port, wherein the cover collecting mechanism is for leading the stripped-off cover tape to the tape discharge port and collectably discharging the stripped-off cover tape from the tape discharge port.

According to a ninth aspect of the present invention, there is provided the electronic component feeding apparatus as defined in the seventh or eighth aspect, wherein the tape discharge port is opened in a vertically downward direction on a lower side of the apparatus mainframe.

According to a tenth aspect of the present invention, there is provided an electronic component feeding apparatus installed in an electronic component mounting apparatus, comprising:

a nearly plate-like mainframe, a reel support member that has a shaft capable of rotatably supporting a component housing reel for winding and housing a taping component composed of a carrier tape, for incorporating electronic components in upper-side recess portions, and a cover tape attached thereto for covering the recess portions, and that is disposed on one end of the mainframe so as to swing along a nearly plate-like face of the mainframe;

a tape sending mechanism disposed on another end of the mainframe for sending the taping component pulled from the reel support member along its transportation route; and a cover stripping-off mechanism disposed on an upper side of the transportation route between the one end and another end of the mainframe for stripping the cover tape from the carrier tape of the taping component sent by the tape sending mechanism along the transportation route of the taping component, wherein the reel support member is able to swing between a support position where the reel support member is capable of supporting the component housing reel on a lower portion along the nearly plate-like face of the mainframe, and a detachment position where the reel support member is capable of detaching the component housing reel on an upper portion along the nearly plate-like face, and wherein the electronic components in the recess portions exposed by stripping-off of the cover tape sequentially pass through a component pickup position of the electronic component mounting apparatus.

According to an eleventh aspect of the present invention, there is provided the electronic component feeding apparatus as defined in the first aspect, further comprising:

a nearly plate-like mainframe; and a reel support member that has a shaft capable of rotatably supporting a component housing reel for winding and housing the taping component, and that is disposed on one end of the mainframe so as to swing along a nearly plate-like face of the mainframe, wherein the tape sending mechanism is disposed on another end of the mainframe and sends the taping component pulled from the reel support member along the transportation route, wherein the cover stripping-off mechanism is disposed on an upper side of the transportation route between the one end and another end of the mainframe, and wherein the reel support member is able to swing between a support position where the reel support member is capable of supporting the component housing reel on a lower portion along the nearly plate-like face of the mainframe, and a detachment position where the reel support member is capable of detaching the component housing reel on an upper portion along the nearly plate-like face.

According to a twelfth aspect of the present invention, there is provided an electronic component feeding apparatus installed in an electronic component mounting apparatus, comprising:

a tape sending mechanism for pulling a taping component composed of a carrier tape, for incorporating electronic components in upper-side recess portions, and a cover tape attached thereto for covering the recess portions, and sending the taping component along its transportation route;

a cover stripping-off mechanism for stripping the cover tape from the carrier tape of the taping component sent by the tape sending mechanism along the transportation route of the taping component; and a cover for covering a recess portion of the carrier tape, exposed by stripping-off of the cover tape, when the electronic component feeding apparatus is not installed in the electronic component mounting apparatus, wherein the cover is always pressed by a pressing member so as to be in a state of covering the exposed recess portion, and when the electronic component feeding apparatus is installed in the electronic component mounting apparatus the cover is moved and adjusted in an opening direction thereof by the electronic component mounting apparatus so as to obtain an opening that enables pickup of the electronic component in the exposed recess portion at a component pickup position, and the electronic components in the recess portions exposed by stripping-off of the cover tape sequentially pass through the component pickup position of the electronic component mounting apparatus.

According to a thirteenth aspect of the present invention, there is provided the electronic component feeding apparatus as defined in the first aspect, further comprising:

a cover for covering a recess portion of the carrier tape, exposed by stripping-off of the cover tape, when the electronic component feeding apparatus is not installed in an electronic component mounting apparatus, wherein the cover is always pressed by a pressing member so as to be in a state of covering the exposed recess portion, and when the electronic component feeding apparatus is installed in the electronic component mounting apparatus the cover is moved and adjusted in an opening direction thereof by the electronic component mounting apparatus so as to obtain an opening that enables pickup of the electronic component in the exposed recess portion at a component pickup position.

According to a fourteenth aspect of the present invention, there is provided an electronic component feeding apparatus comprising:

a tape sending mechanism for sending a taping component composed of a carrier tape, for incorporating electronic components in upper-side recess portions, and a cover tape attached thereto for covering the recess portions along its transportation route;

a cover stripping-off mechanism for stripping the cover tape from the carrier tape of the taping component sent by the tape sending mechanism along the transportation route of the taping component;

a cover collecting mechanism for serially sending stripped-off cover tape in a collectable manner to a collection position;

an operation monitoring device for outputting an operational monitoring signal of a sending operation of the taping component or a sending operation of the cover tape;

an error reporting device for reporting a sending failure of the taping component; and a control part for executing, upon reception of power feed from an electronic component mounting apparatus when the electronic component feeding apparatus is installed in the electronic component mounting apparatus, automatic tape sending processing for outputting an operational control signal to the tape sending mechanism, the cover stripping-off mechanism, or the cover collecting mechanism so that an electronic component exposed in a recess portion is positioned at a component pickup position, and executing, based on the operational monitoring signal inputted by the operation monitoring device during execution of the automatic tape sending processing, error reporting processing for determining an error in the sending operation of the taping component or the sending operation of the cover tape as a sending failure of the taping component, and for operating the error reporting device upon determination of the sending failure, wherein the electronic components in the recess portions exposed by stripping-off of the cover tape are sequentially fed to the component pickup position of the electronic component mounting apparatus.

According to a fifteenth aspect of the present invention, there is provided the electronic component feeding apparatus as defined in the first aspect, comprising:

an operation monitoring device for outputting an operational monitoring signal of a sending operation of the taping component or a sending operation of the cover tape;

an error reporting device for reporting a sending failure of the taping component; and a control part for executing automatic tape sending processing, upon reception of power feed from an electronic component mounting apparatus when the electronic component feeding apparatus is installed in the electronic component mounting apparatus, for outputting an operational control signal to the tape sending mechanism, the cover stripping-off mechanism, or the cover collecting mechanism so that an electronic component exposed in a recess portion is positioned at a component pickup position, and executing, based on the operational monitoring signal inputted by the operation monitoring device during execution of the automatic tape sending processing, error reporting processing for determining an error in the sending operation of the taping component or the sending operation of the cover tape as a sending failure of the taping component, and for operating the error reporting device upon determination of the sending failure.

According to a sixteenth aspect of the present invention, there is provided the electronic component feeding apparatus as defined in the fourteenth or fifteenth aspect, wherein the operational monitoring device is operable to output an operational monitoring signal of a sending operation of the taping component and an operation monitoring signal of sending operation of the cover tape, the error reporting device is operable to report an error in the sending operation of the taping component or an error in the sending operation of the cover tape as sending failure of the taping component, the control part is operable to execute, based on the operational monitoring signal of the sending operation of the taping component and the operational monitoring signal of the sending operation of the cover tape inputted by the operation monitoring device during execution of the automatic tape sending processing, error reporting processing for determining an error in the sending operation of the taping component or an error in the sending operation of the cover tape as the sending failure of the taping component, and for operating the error reporting device upon determination of the sending failure.

According to a seventeenth aspect of the present invention, there is provided the electronic component feeding apparatus as defined in any one of the fourteenth to sixteenth aspects, wherein the operation monitoring device has a timer for measuring time required for the automatic tape sending processing, and the control part is operable to determine the sending failure of the taping component upon determining that the automatic tape sending processing is not completed within a specified time based on the operational monitoring signal inputted by the timer.

According to an eighteenth aspect of the present invention, there is provided the electronic component feeding apparatus as defined in any one of the fourteenth to sixteenth aspects, wherein the operation monitoring device has a lever operation monitoring sensor for monitoring rotational operation of a tension-imparting lever that is operable to execute the rotational operation when the cover sending mechanism conducts sending of a specified amount during the automatic tape sending processing, and the control part is operable to execute the rotational operation based on the operational monitoring signal inputted by the lever operation monitoring sensor during the automatic tape sending processing.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
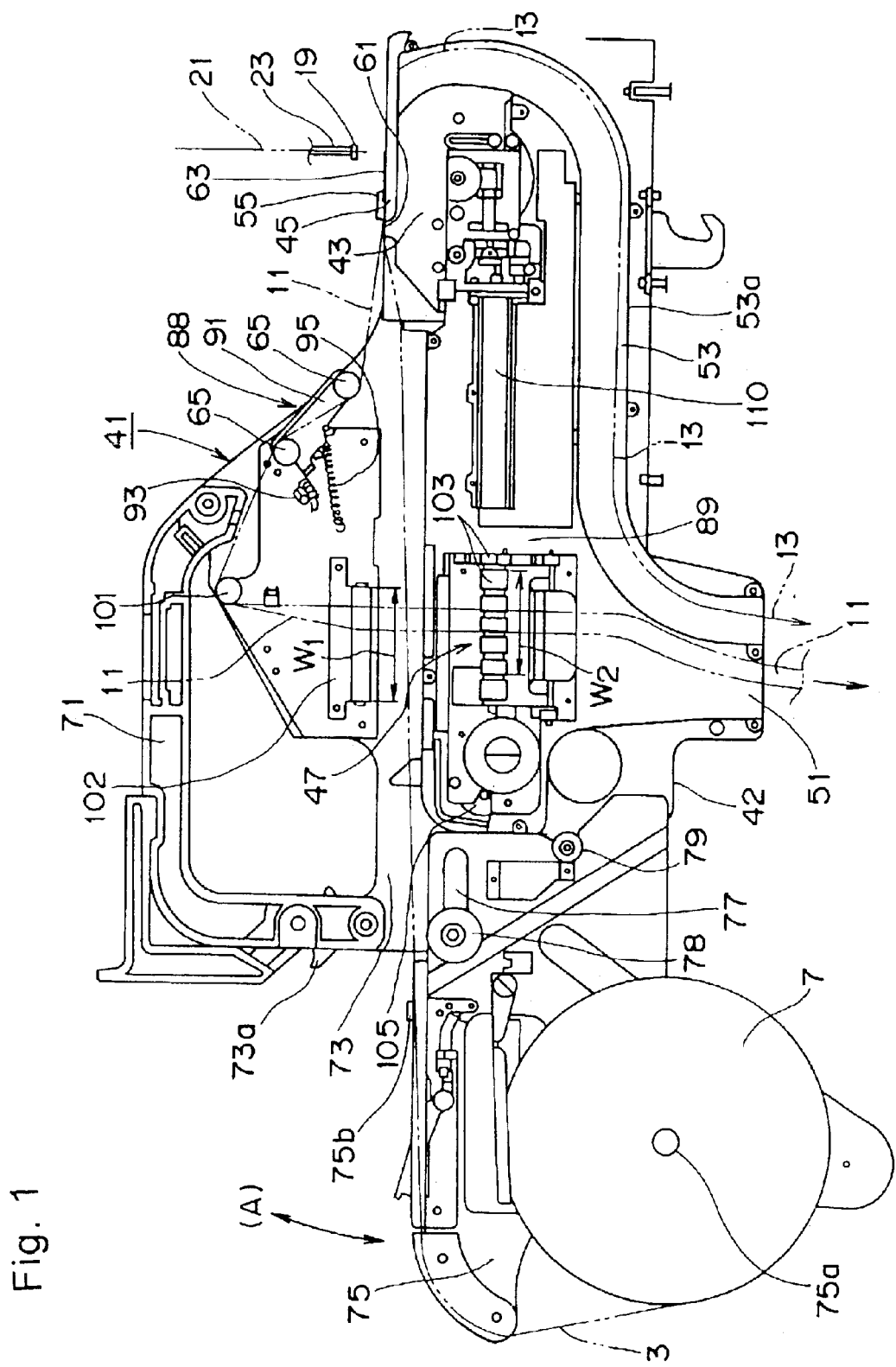
FIG. 1 is a right side view showing an electronic component feeding apparatus in a first embodiment of the present invention.

Before description of the present invention proceeds, it is to be noted that like parts are designated by like reference numerals throughout the accompanying drawings.

Hereinbelow, a first embodiment of the present invention will be described in detail with reference to the drawings.

Figure 2:
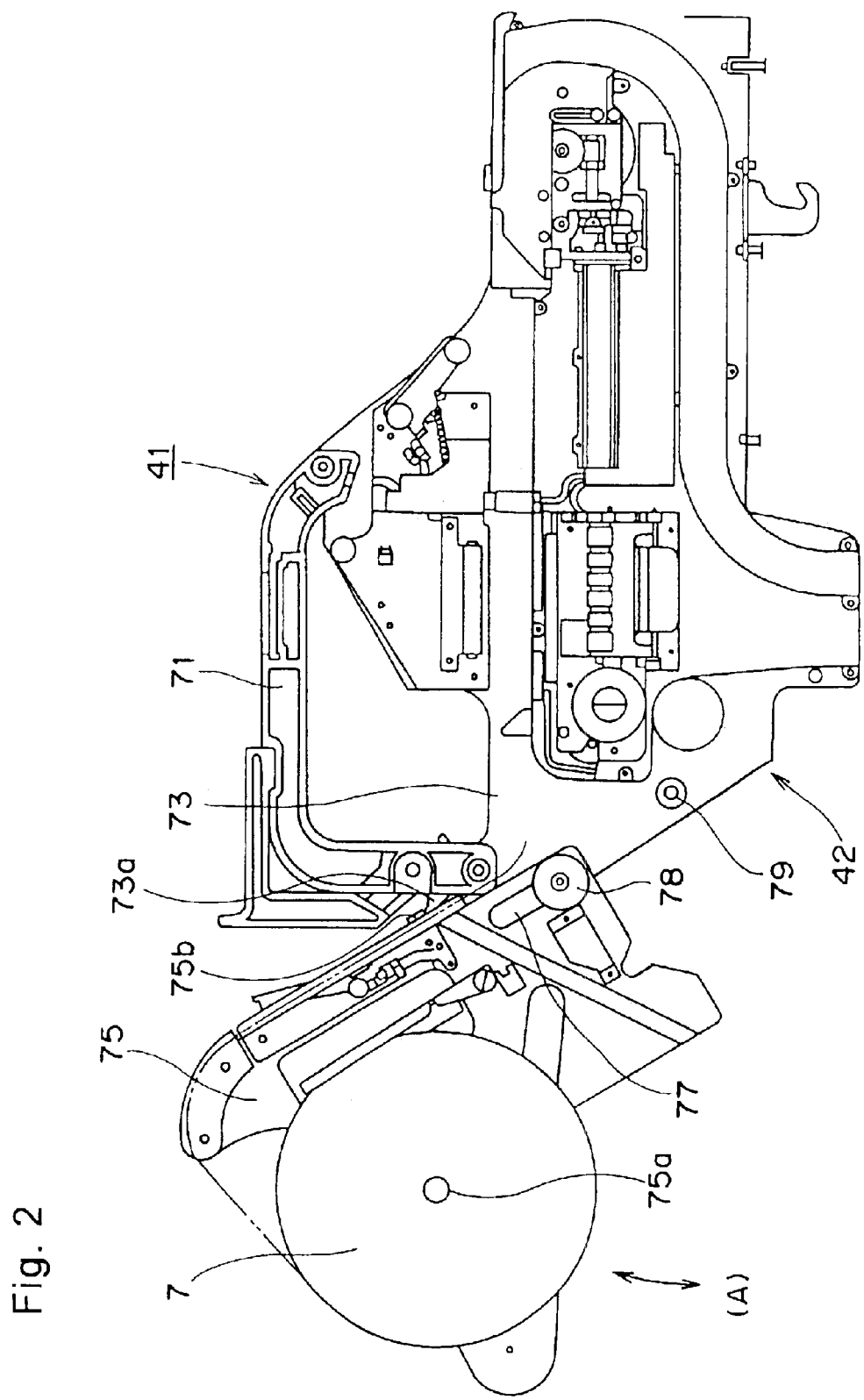
FIG. 2 is a right side view showing behavior of a reel supporting member during a process of replacing a component housing reel in the electronic component feeding apparatus shown in FIG. 1.
Figure 3:
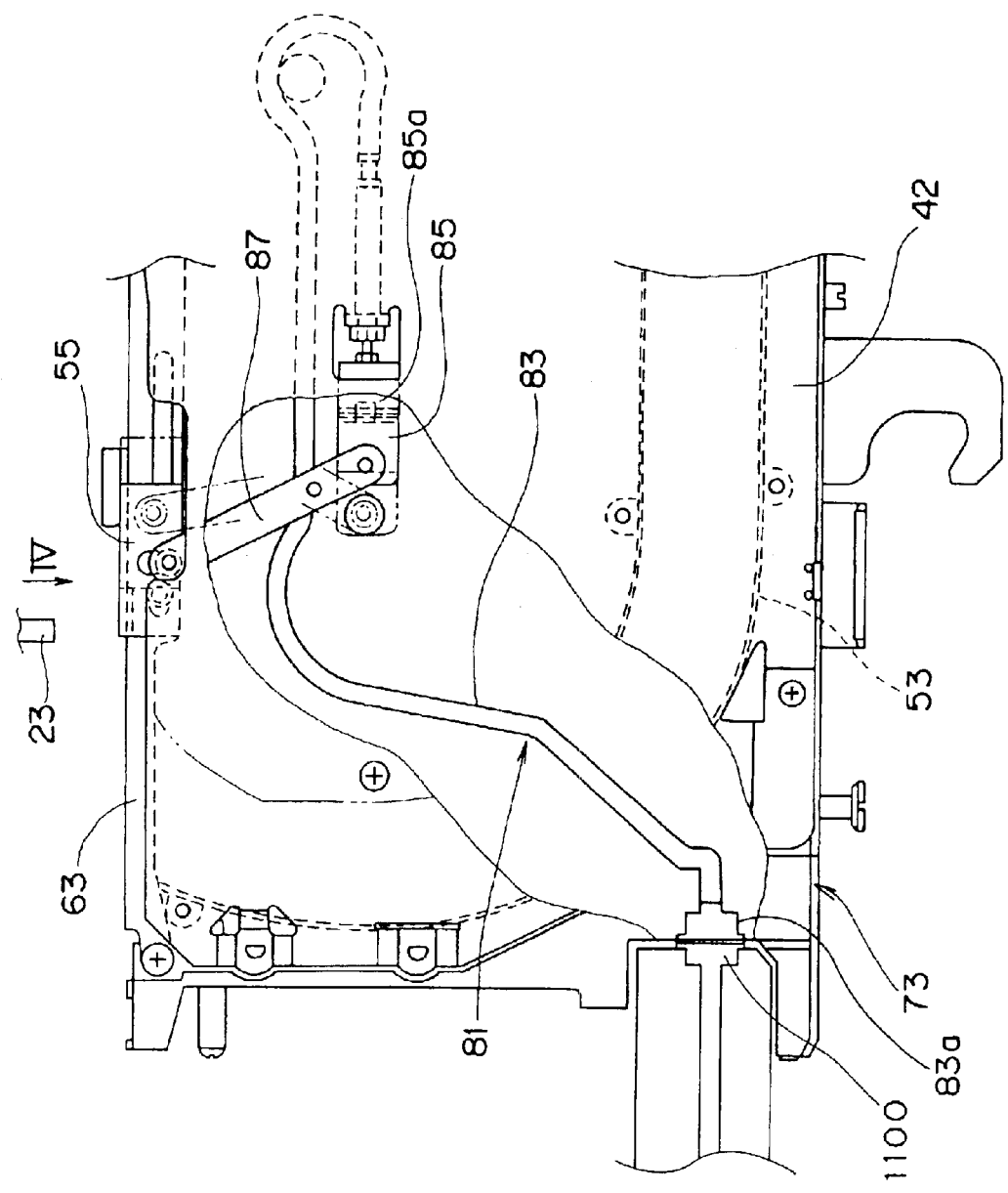
FIG. 3 is a left side view showing a cover of the electronic component feeding apparatus shown in FIG. 1 in a closed state.
Figure 4:
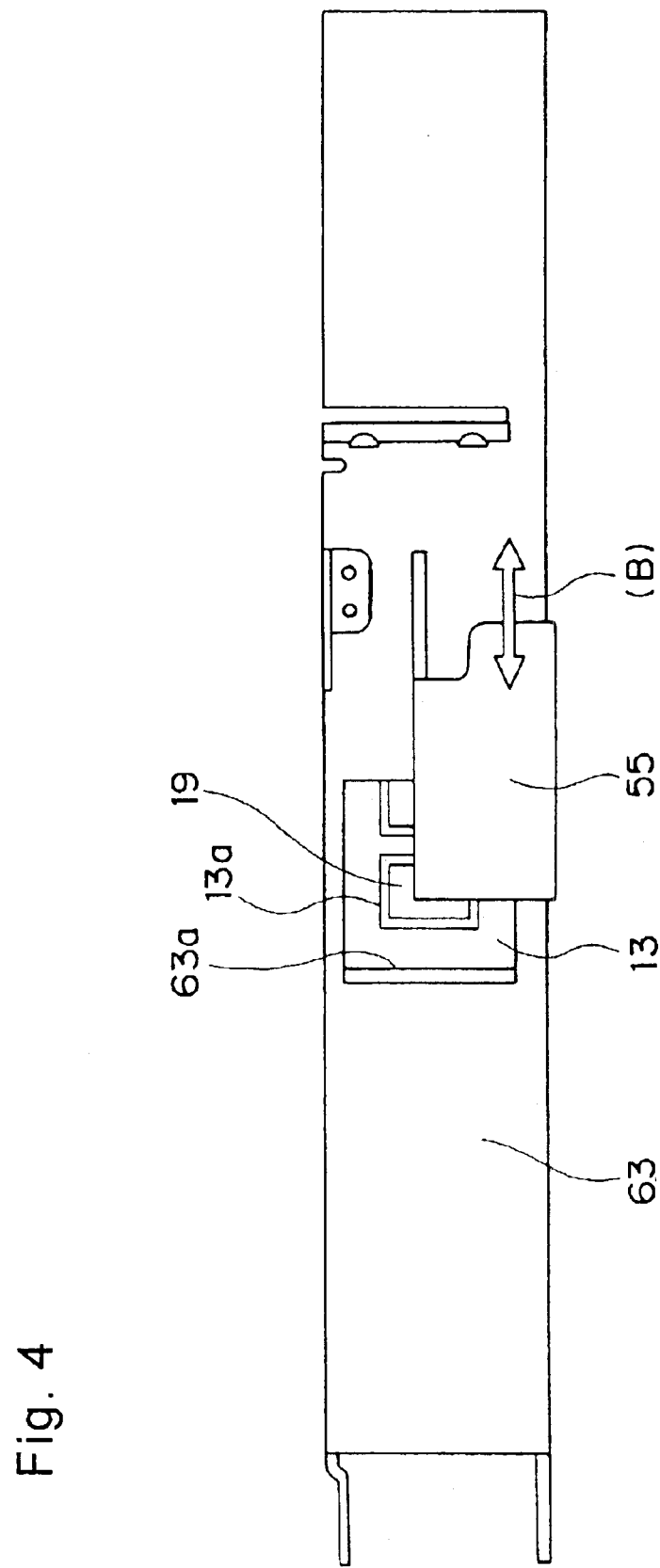
FIG. 4 is a plan view seen along arrow IV of FIG. 3.
Figure 5:
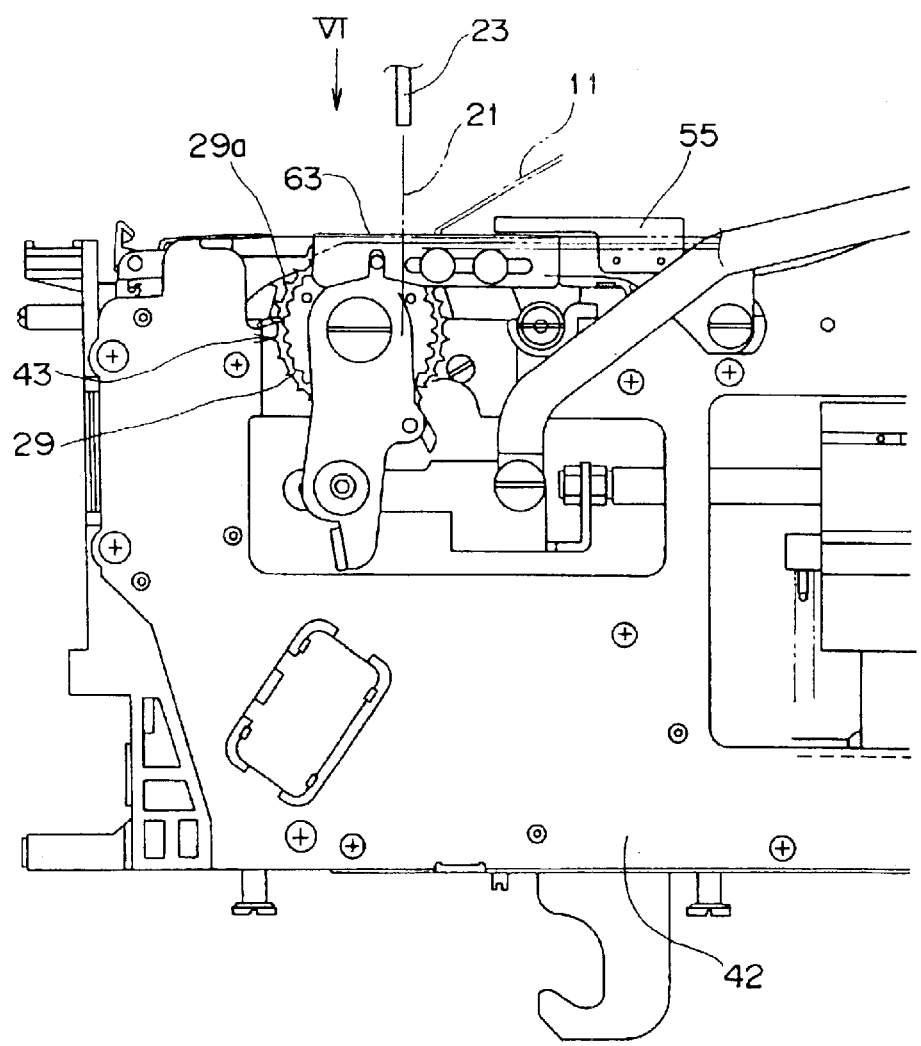
FIG. 5 is a left side view showing a cover of the electronic component feeding apparatus shown in FIG. 1 in an open state.
Figure 6:
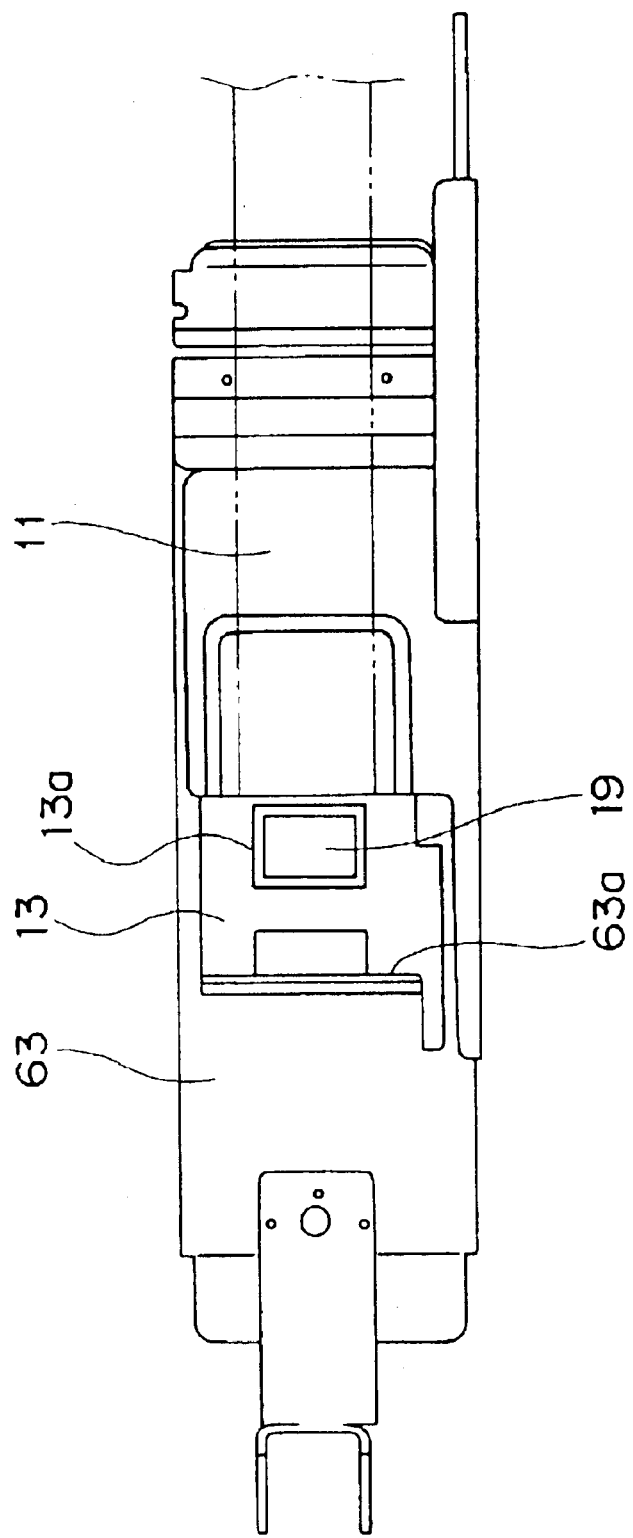
FIG. 6 is a plan view seen along arrow VI of FIG. 5.

An electronic component feeding apparatus in the first embodiment of the present invention is shown in FIGS. 1 to 6, in which FIG. 1 is a right side view showing the electronic component feeding apparatus in the first embodiment of the present invention, FIG. 2 is a right side view showing behavior of a reel supporting member during a process of replacing a component housing reel in the electronic component feeding apparatus shown in FIG. 1, FIG. 3 is a left side view showing a cover of the electronic component feeding apparatus shown in FIG. 1 in a closed state, FIG. 4 is a plan view seen along arrow IV of FIG. 3, FIG. 5 is a left side view showing the cover of the electronic component feeding apparatus shown in FIG. 1 in an open state, and FIG. 6 is a plan view seen along arrow VI of FIG. 5.

An electronic component feeding apparatus 41 in the first embodiment comprises: a component housing reel 7 disposed on one end of an apparatus mainframe 42 of the electronic component feeding apparatus for winding up and housing a taping component 3 composed of a carrier tape 13, for incorporating electronic components 19 in upper-side recess portions 13a, and a cover tape 11 attached thereto for covering the recess portions 13a; a tape sending mechanism 43 for sending the taping component 3 pulled from the component housing reel 7 by a constant length along a transportation route; a cover stripping-off mechanism 45 for stripping the cover tape 11 from the carrier tape 13 of the taping component 3 sent by the tape sending mechanism 43 at a specified position along the transportation route of the taping component 3; a single tape discharge port 51 opened on a lower face of the apparatus mainframe 42 for discharging a dead cover tape 11 and the carrier tape 13 to an exterior of the apparatus; a cover collecting mechanism 47 for serially sending off the cover tape 11 stripped off by the cover stripping-off mechanism 45 to the tape discharge port 51, that is one example of a collecting position, and collecting the stripped-off cover tape 11; a carrier collecting mechanism 53 for sending off a dead carrier tape 13, after completion of pickup of an electronic component 19, to the tape discharge port 51 and collecting the carrier tape 13; and a cover 55 for covering the electronic component 19 on the carrier tape 13 exposed by stripping-off of the cover tape 11 when the electronic component feeding apparatus is not installed in an electronic component mounting apparatus. It is noted that the component housing reel 7 and the taping component 3 have a constitution identical to conventional component members.

Figure 32:
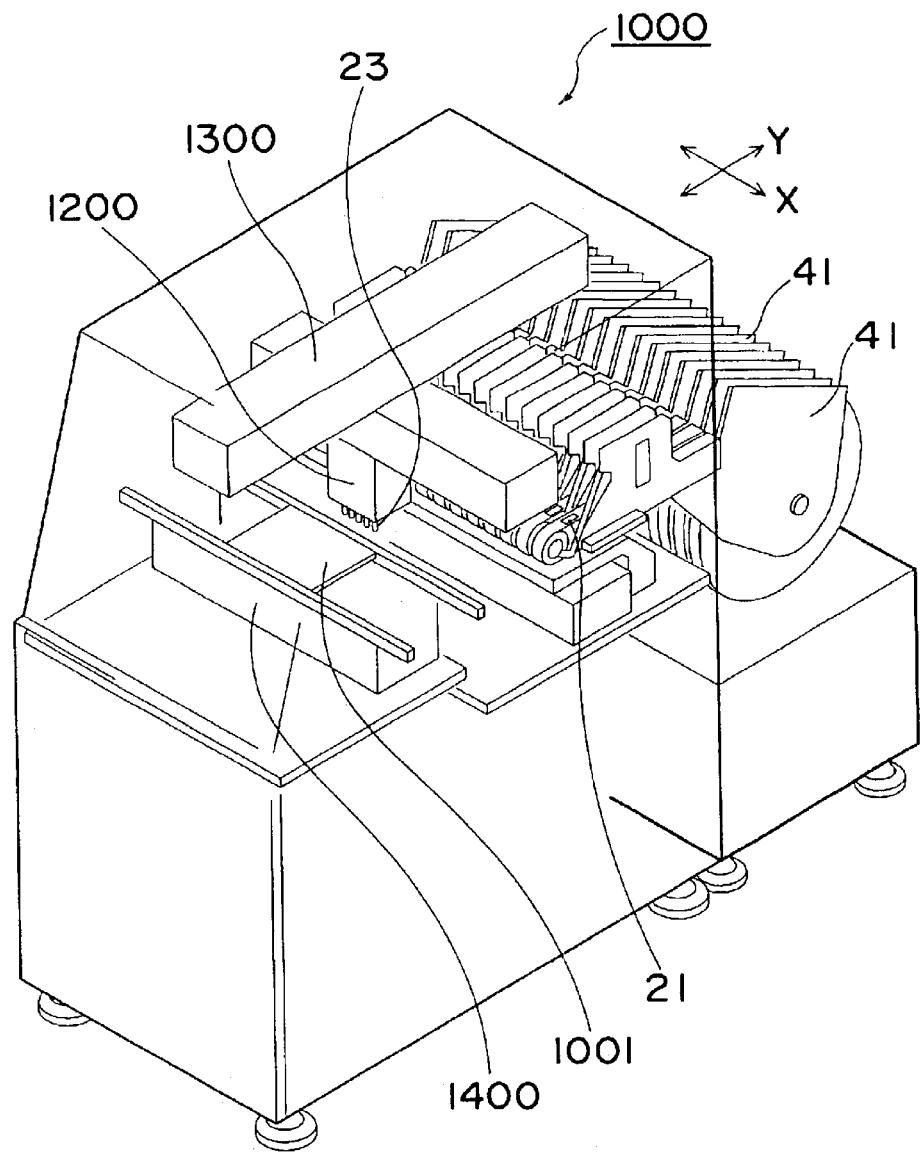
FIG. 32 is a cross sectional view showing an electronic component mounting apparatus equipped with a plurality of the electronic component feeding apparatuses of the first embodiment shown in FIG. 1.

FIG. 32 is a perspective view of an electronic component mounting apparatus 1000 equipped with a plurality of electronic component feeding apparatuses 41 for showing one example in a case where the electronic component feeding apparatus 41 is installed in an electronic component mounting apparatus. As shown in FIG. 32, the electronic component mounting apparatus 1000 comprises: a head unit 1200 having a plurality of suction nozzles 23 exemplifying sucking and holding members capable of sucking and holding a plurality of the electronic components 19; an XY robot 1300 exemplifying a movement mechanism capable of moving the head unit 1200 in an X axis direction or a Y axis direction in the drawing; and a stage 1400 for holding a circuit board 1001 onto which electronic components 19 are mounted. At a component pickup position 21 of the electronic component feeding apparatus 41, an electronic component 19 sucked and held by suction nozzle 23 is moved and mounted onto the circuit board 1001 by the head unit 1200 moved by the XY robot 1300.

The apparatus mainframe 42 of the electronic component feeding apparatus 41 in the first embodiment has a nearly plate-like shape, which is composed of a mainframe framework 73 having a handle 71 serving as a holding portion at a time of movement, and a reel support frame 75 exemplifying a reel support member connected to a rear end portion of the mainframe framework 73 so as to swing in an arrow-A direction orthogonal to a direction of a disposing position of the electronic component feeding apparatus (a direction orthogonal to the face of the paper of FIG. 1). In the mainframe framework 73, there are installed the tape sending mechanism 43, the cover stripping-off mechanism 45, the cover collecting mechanism 47, the tape discharge port 51, the carrier collecting mechanism 53 and the like.

The reel support frame 75, which is linked to the mainframe framework 73 via a link pin 78 for engaging with a long hole 77, a positioning engagement pin 79 and the like, is capable of swinging upwardly as shown in FIG. 2.

The component housing reel 7 is supported detachably and rotatably around a shaft 75*a* of the reel support frame 75 at a position close to a swinging edge of the reel support frame 75. Also, the reel support frame 75 is capable of swinging between a support position where the reel support frame 75 is capable of supporting the component housing reel 7 in a lower portion along a nearly plate-like face of the apparatus mainframe 42, and a detachment position where the reel support frame 75 is capable of detaching the component housing reel 7 at an upper portion thereof. As shown in FIG. 2, by engaging an engagement part 73*a* in the mainframe framework 73, provided above the long hole 77 in the reel support frame 75, and an engagement part 75*b*, provided on an upper portion of the reel support frame 75, with each other, the reel support frame 75 may be held in the detachment position, and by the engagement pin 79 provided on the mainframe framework 73, the reel support frame 75 may be held in the support position. Also, a distance between the position of the shaft 75*a* of the reel support frame 75 in the detachment position and the position of the shaft 75*a* in the support position is larger than a diametrical dimension of the component housing reel 7. Consequently, the reel support frame 75 is usually used in the support position, that is, such a position corresponding to the taping component 3 being sent approximately rectilinearly from the reel support frame 75 toward the tape sending mechanism 43 as shown in FIG. 1, whereas at a time of replacing the component housing reel 7, the reel support frame 75 is swung upwardly to the detachment position so as to be in a state as shown in FIG. 2, which makes it possible to prevent component housing reels of other adjacent electronic component feeding apparatuses from being obstructive in the detachment position.

Also, the tape discharge port 51 is provided on a bottom of the mainframe framework 73 in a state of being opened downwardly so as to enable insertion and passing-through of tape in a vertical direction.

As shown in FIG. 5, the tape sending mechanism 43 transports a constant amount of the taping component 3 by applying a constant rate of rotational drive to a wheel 29 exemplifying a first rotary member that has engagement hooks 29*a*, for engaging with engagement holes 13*b* of the carrier tape 13, protrudingly provided at constant pitches on a periphery of the wheel. Also, as shown in FIG. 1, the tape sending mechanism 43 is provided with a drive motor 110 exemplifying a first drive motor, and the drive motor 110 rotates the wheel 29 that is set such that a central axis of rotation is approximately orthogonal to a lateral face of the electronic component feeding apparatus 41. It is noted that the drive motor 110 is a brushless motor.

A component pickup position 21 of the electronic component mounting apparatus is set in the vicinity where the engagement hooks 29*a* of the wheel 29 fit into the engagement holes 13*b* of the carrier tape 13, and the electronic component mounting apparatus has a suction nozzle 23 for sucking the electronic component 19 by vacuum suction force at the component pickup position 21.

In the vicinity of the component pickup position 21, there is provided a shutter 63 that conducts positioning by pressing the taping component 3 to a specified tape transportation face 61.

Figure 22:
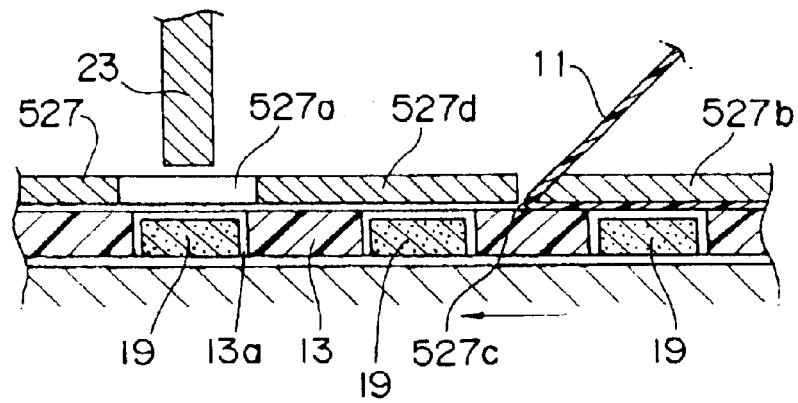
FIG. 22 is an enlarged cross sectional view showing the vicinity of a component pickup position in the electronic component feeding apparatus shown in FIG. 19.
Figure 23:
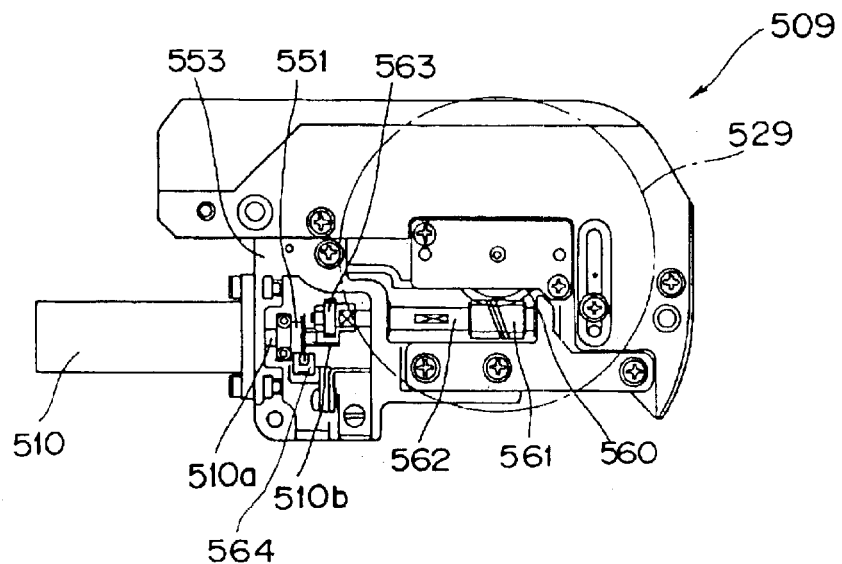
FIG. 23 is a side view of a tape sending mechanism with a drive motor being mounted thereon among explanational views showing replacement procedures of the drive motor in the tape sending mechanism of the electronic component feeding apparatus shown in FIG. 19.
Figure 24:
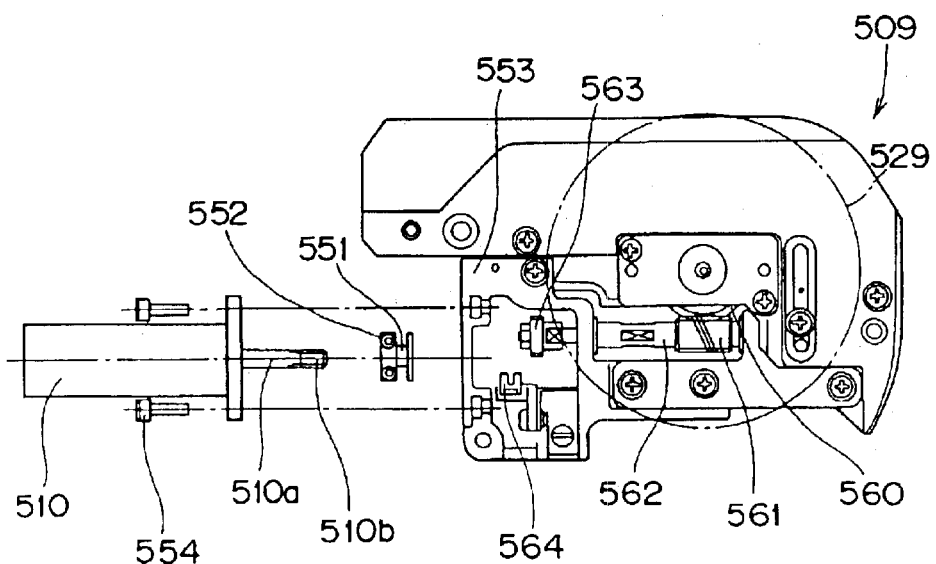
FIG. 24 is a side view of the tape sending mechanism with the drive motor being dismounted therefrom among explanational views showing the replacement procedures.
Figure 25:
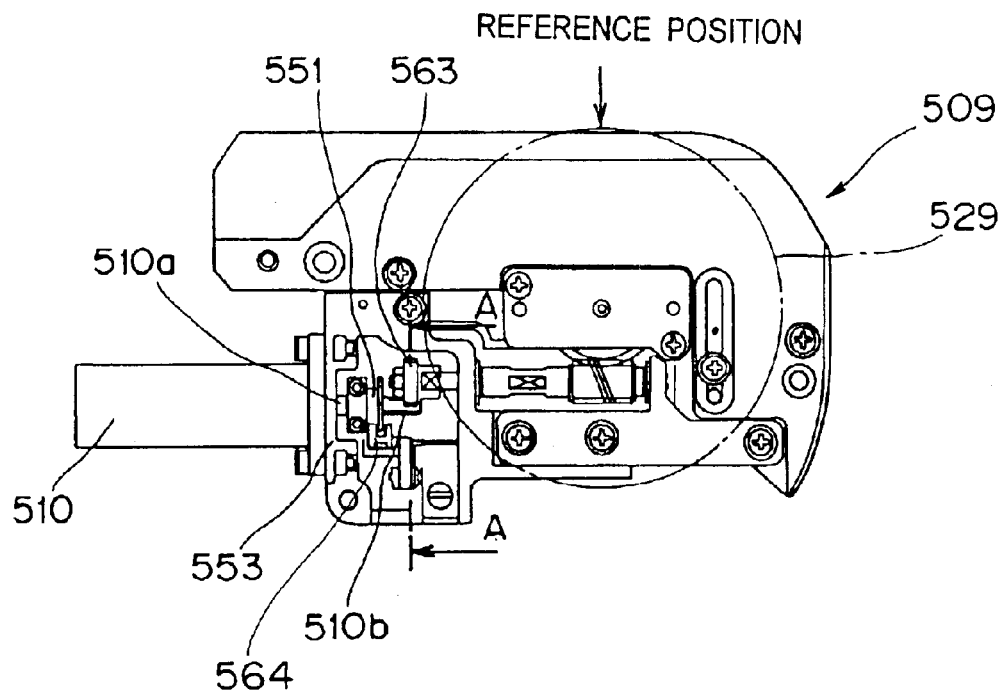
FIG. 25 is a side view of the tape sending mechanism with a drive motor being mounted thereon among explanational views showing adjustment procedures after the drive motor is replaced in the tape sending mechanism of the electronic component feeding apparatus shown in FIG. 19.
Figure 26:
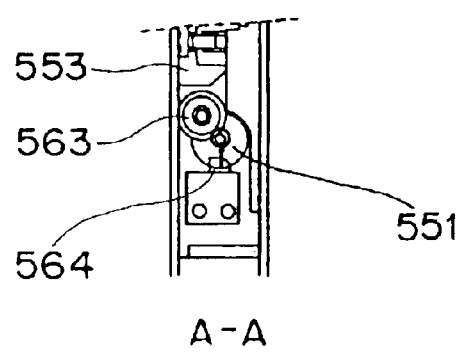
FIG. 26 is a cross sectional view taken along line A—A of FIG. 25.
Figure 27:
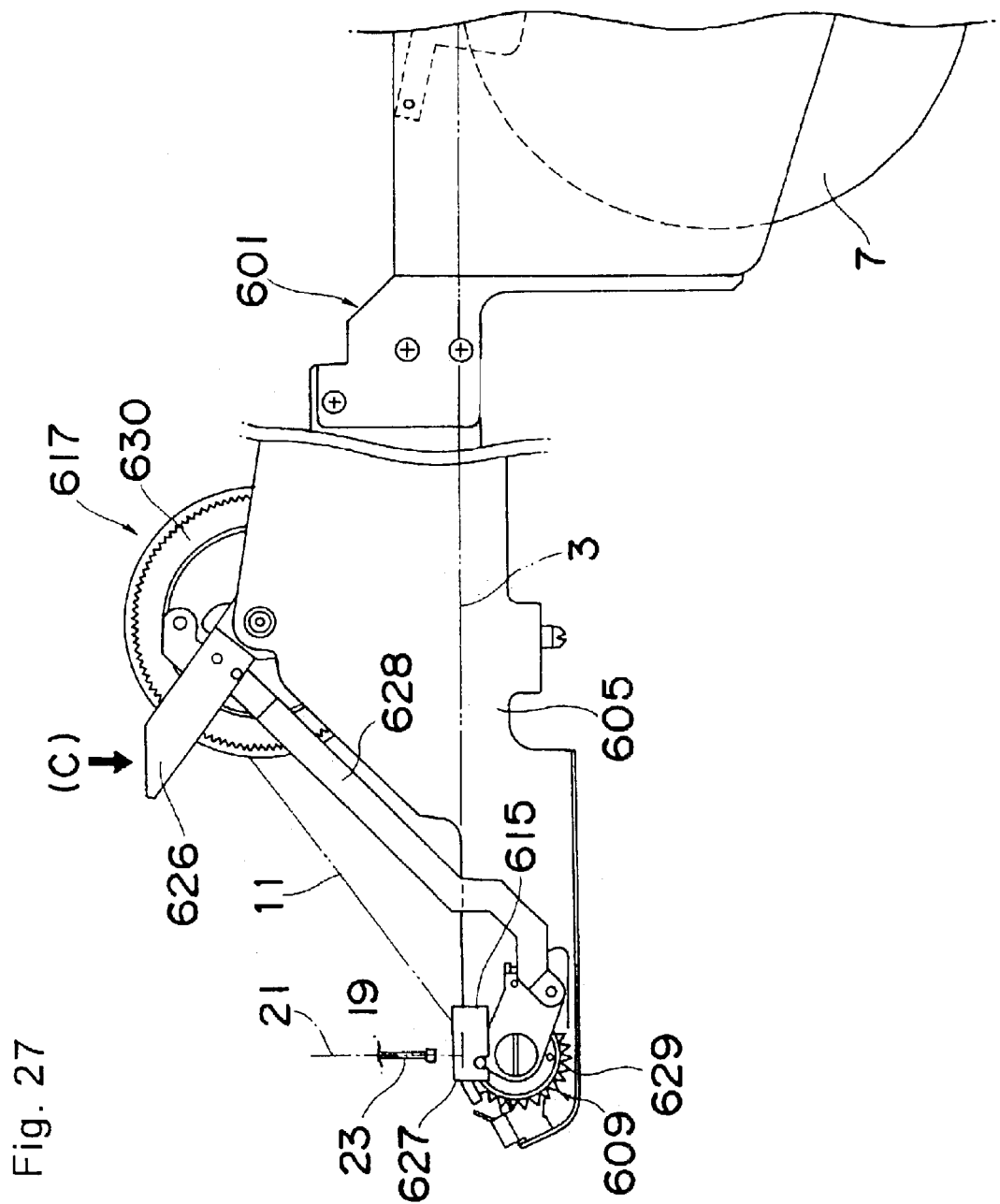
FIG. 27 is a left side view showing another example of the conventional electronic component feeding apparatus.
Figure 28:
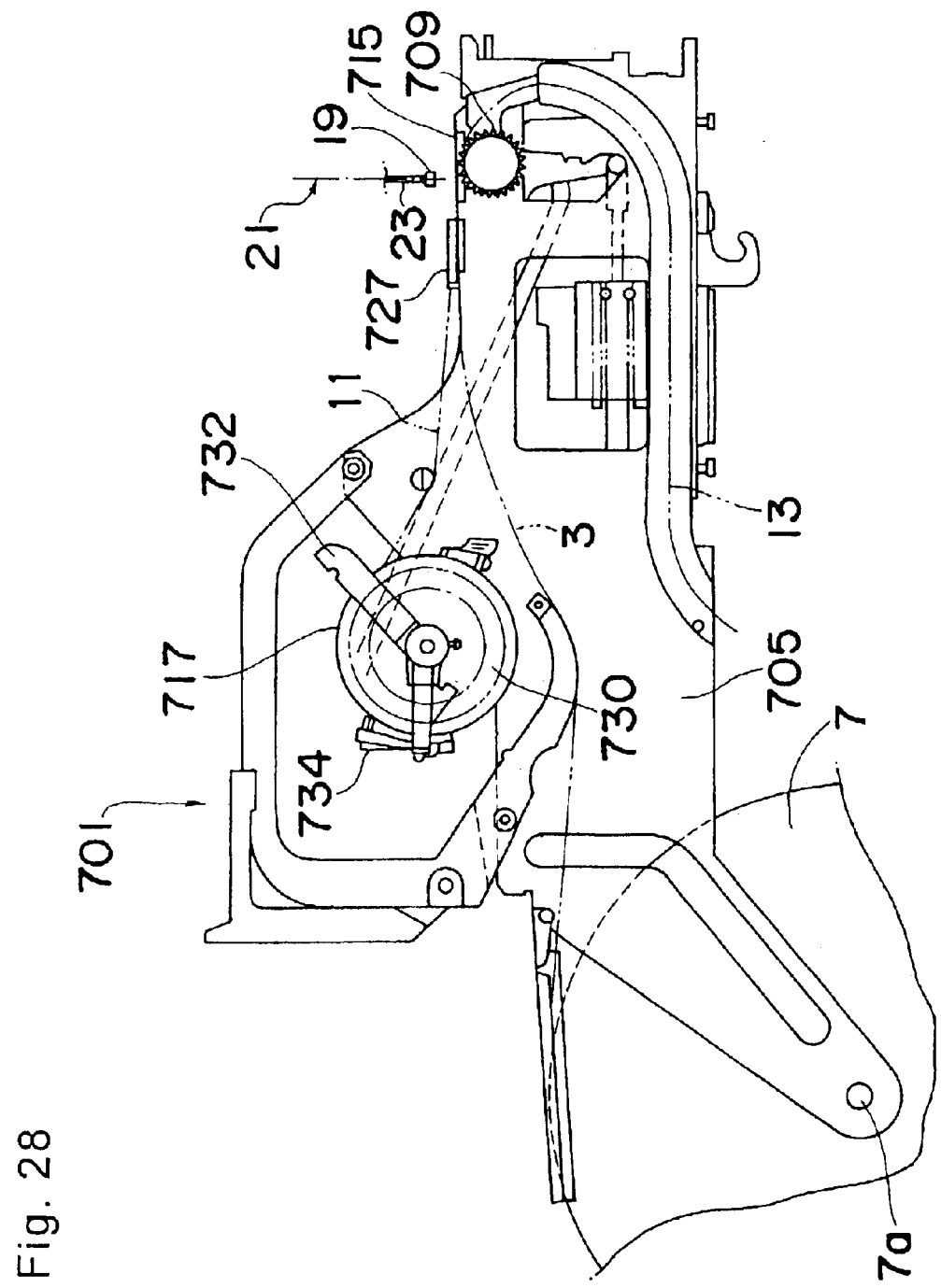
FIG. 28 is a right side view showing still another example of the conventional electronic component feeding apparatus.
Figure 29:
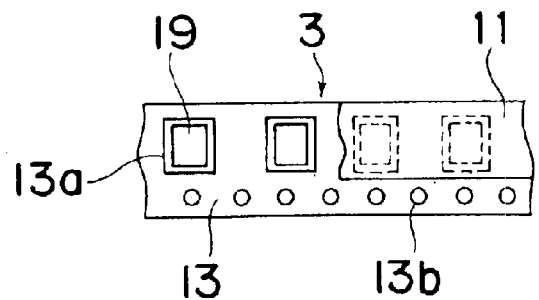
FIG. 29 is a plan view showing a constitution of a taping component set in the electronic component feeding apparatus of FIG. 27 or FIG. 28.
Figure 30:
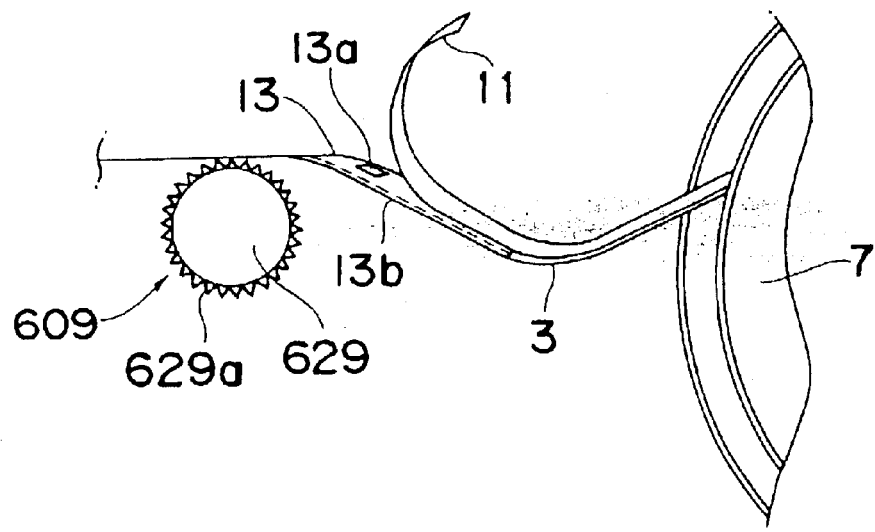
FIG. 30 is a schematic constituent view showing a tape sending mechanism of the electronic component feeding apparatus shown in FIG. 27.

The shutter 63 has the same constitution as shutter 527 shown in FIG. 22, in which there are provided a stripping part serving as the cover stripping-off mechanism 45 for stripping off the cover tape 11 from the carrier tape 13, and a component pickup port 63*a* for the suction nozzle 23 to pick up the electronic component 19. The shutter 63 is reciprocally driven in synchronization with operation of the tape sending mechanism 43 and with a sucking operation of the suction nozzle 23.

The cover 55 covers the component pickup port 63*a* for preventing electronic component 19 housed in recess portion 13*a* of the carrier tape 13 from falling from the component pickup port 63*a* at a time of un-installing the electronic component feeding apparatus 41 from the electronic component mounting apparatus and moving the electronic component feeding apparatus 41.

The cover 55 is, as shown in FIG. 3 and FIG. 4, always pressed by a spring 85*a* incorporated in an actuator 85 of a later-described drive mechanism 81 exemplifying a pressing member so as to be in a closed state of covering electronic component 19 exposed to the component pickup port 63*a*, and when installed in the electronic component mounting apparatus, the cover 55 is moved and adjusted in an open direction by operation of the drive mechanism 81 so as to obtain an opening large enough for pickup of electronic component 19 at the component pickup position 21.

The drive mechanism 81 comprises: a connecting pipe 83 connected to a vacuum suction pipeline 1100 on a side of the electronic component mounting apparatus when the electronic component feeding apparatus is installed in the electronic component mounting apparatus; an actuator 85 operated by negative pressure fed via the connecting pipe 83; and a link mechanism 87 for converting operation of the actuator 85 to reciprocal movement necessary for opening and closing the cover 55. The drive mechanism 81 is structured such that when the electronic component feeding apparatus is not installed in the electronic component mounting apparatus, the actuator 85 is in a state of operation halt, and the spring 85*a* incorporated in the actuator 85 returns the cover 55 to the closed state.

Further, a displacement magnitude of the actuator 85 applied to the cover 55 in an arrow-B direction may be adjusted corresponding to a size and the like of electronic component 19 to be handled.

The cover collecting mechanism 47 sends the cover tape 11, stripped from the carrier tape 13 by the cover stripping-off mechanism 45, to the tape discharge port 51 with aid of a tension adjustment mechanism 88 and a twist transportation mechanism 89.

The tension adjustment mechanism 88 is provided with a tension-imparting lever 91 for imparting specified tension to the cover tape 11 to be taken up along the transportation route of the cover tape 11 from the cover stripping-off mechanism 45 to the twist transportation mechanism 89, and is provided with a lever operation monitoring sensor 93 for monitoring a rotational operation of the tension-imparting lever 91.

The tension-imparting lever 91, which is pressed by a compression coil spring 95, exemplifying a pressing member, so that a pair of positioning rollers 65 disposed on the lever provide pressing force to the cover tape 11, is capable of removing sagging of the cover tape 11 and provides tension, enabling a smooth sending of the cover tape 11, to the cover tape 11.

The twist transportation mechanism 89 twists the cover tape 11, that has passed through the tension adjustment mechanism 88, between a positioning roller 101 and a first sending roller 102 so as to set a tape face to be parallel to a lateral face of the electronic component feeding apparatus 41, and sends the cover tape 11 in this state of being parallel to the lateral face of the electronic component feeding apparatus 41 to the tape discharge port 51 by virtue of a second sending roller 103 exemplifying a second rotary member.

The positioning roller 101 has a central axis of rotation set to be approximately orthogonal to the lateral face of the electronic component feeding apparatus 41, like the positioning rollers 65 of the tension adjustment mechanism 88. Contrary to this, the first and the second sending rollers 102 and 103 have a central axis of rotation set to be approximately parallel to the lateral face of the electronic component feeding apparatus 41.

With such disposition of the rollers, the cover tape 11 that has passed through the tension adjustment mechanism 88 is twisted 90 degrees on a route from the positioning roller 101 to the first sending roller 102, which puts the tape face in a state of being approximately parallel to the lateral face of the electronic component feeding apparatus 41.

The twist transportation mechanism 89 sends the cover tape 11, that has passed through the first sending roller 102, to the tape discharge port 51 by rotationally driving the second sending roller 103 by a drive motor 105 exemplifying a second drive motor. The drive motor 105 is a brushless motor.

It is noted that instead of a case where the drive motor 110 in the tape sending mechanism 43 and the drive motor 105 in the twist transportation mechanism 89 are both brushless motors, there may be a case where only either one of the drive motor 110 in the tape sending mechanism 43 and the drive motor 105 in the twist transportation mechanism 89 is a brushless motor.

Also, the first and the second sending rollers 102, 103 are set such that axial length dimensions (i.e., width dimensions of a circumferential face thereof in contact with the cover tape 11) W1, W2 are larger than a maximum value of a width of the cover tape 11 in the taping component 3 handled in the electronic component feeding apparatus 41.

As shown in FIG. 1, the carrier collecting mechanism 53 leads the carrier tape 13, that has passed through the component pickup position 21 with the cover tape 11 stripped off, to the tape discharge port 51 via an approximately sigmoid transportation route 53a provided on the mainframe framework 73.

The transportation route 53a is a smooth passage whose one end is opened to the vicinity of the component pickup position 21 and the other end is opened to the tape discharge port 51.

Operational procedures in a case of replacing the drive motor 110 in the tape sending mechanism 43 and the drive motor 105 in the cover collecting mechanism 47, as an example of a case of replacing the drive motor 110 in the tape sending mechanism 43 in the above electronic component feeding apparatus 41, will be described below.

Figure 7:
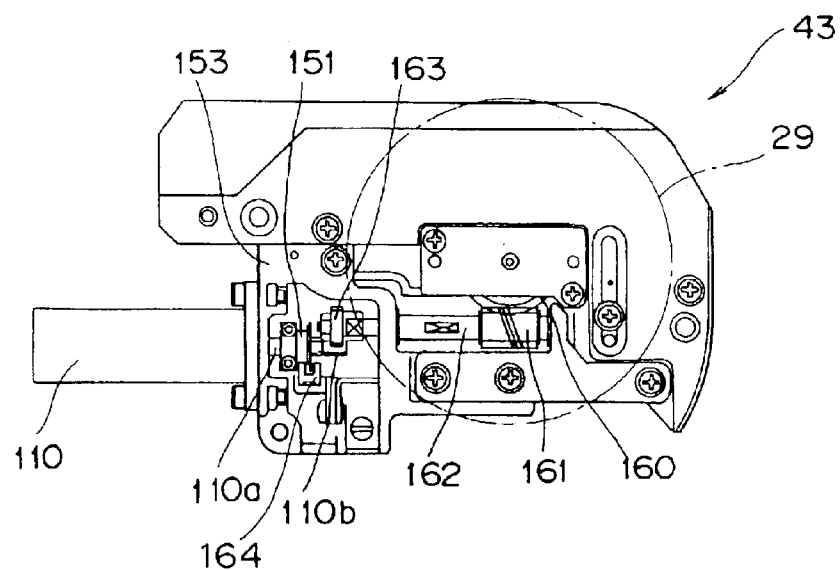
FIG. 7 is a side view of a tape sending mechanism with a drive motor being mounted thereon among explanational views showing replacement procedures of the drive motor in the tape sending mechanism of the electronic component feeding apparatus shown in FIG. 1.

First, a relationship between the drive motor 110 and the wheel 29 in the tape sending mechanism 43 will be described. As shown in FIG. 7, in the tape sending mechanism 43, the drive motor 110 is fixed to a frame 153. To a rotational axis part 110a of the drive motor 110, there is fixed a slit plate for sensor 151 for a rotational speed measuring sensor 164 for measuring a rotational speed of the drive motor 110. The slit plate for sensor 151 is rotated by the drive motor 110 such that a peripheral portion of the slit plate for sensor 151 can pass inside the slit portion of the rotational speed measuring sensor 164 without making any contact therewith. Also, to the wheel 29, there is fixed a worm wheel 160 so as to have the same center of rotation. Since a worm 161 to be engaged with the worm wheel 160 is fixed to an axis part 162, rotating the axis part 162 about an axis rotates the worm 161, and thereby rotates the worm wheel 160 engaged with the worm 161, resulting in rotation of the wheel 29. Also, to a top end portion of the axis part 162 on the left side of the drawing, there is fixed a gear part 163. A gear part 110b, formed on a top end of the rotational axis part 110a of the drive motor 110, and the gear part 163 are engaged with each other. This enables rotational operation of the wheel 29 by the drive motor 110.

Figure 8:
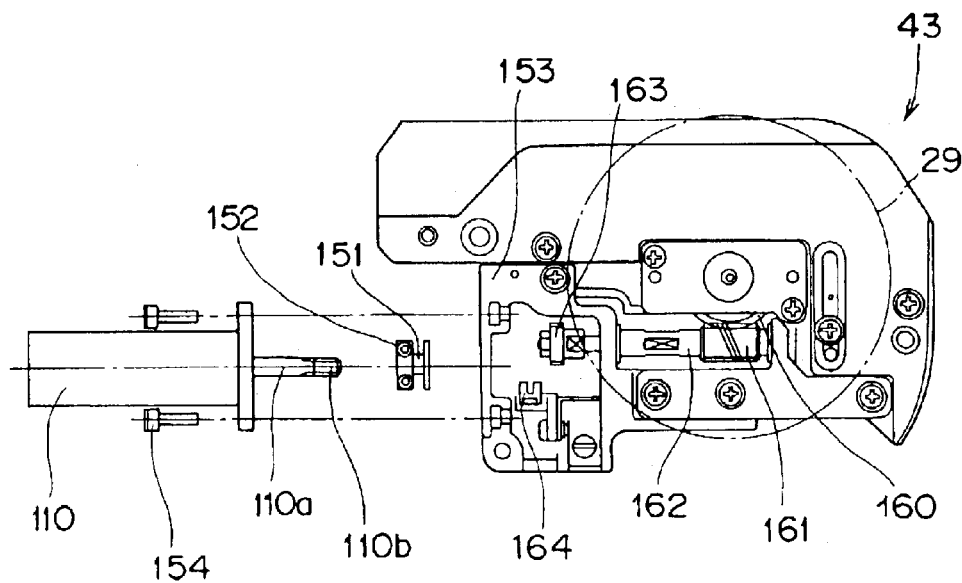
FIG. 8 is a side view of the tape sending mechanism with the drive motor being dismounted therefrom among the explanational views showing the replacement procedures.

Next, description will be given of dismounting procedures of the drive motor 110. As shown in FIG. 7, by loosening a screw and the like, the tape sending mechanism 43 is dismounted as a unit from the apparatus mainframe 42. Then, in the tape sending mechanism 43 as shown in FIG. 8, for measuring the rotational speed of the drive motor 110, a fixing screw 152, for fixing the slit plate for sensor 151 fixed to the rotational axis part 110a of the drive motor 110 to the rotational axis part 110a of the drive motor 110, is loosened, and a fixing screw 154, for fixing the drive motor 110 to the frame 153 of the tape sending mechanism 43, is unscrewed, so that the drive motor 110 is extracted from the frame 153.

Figure 9:
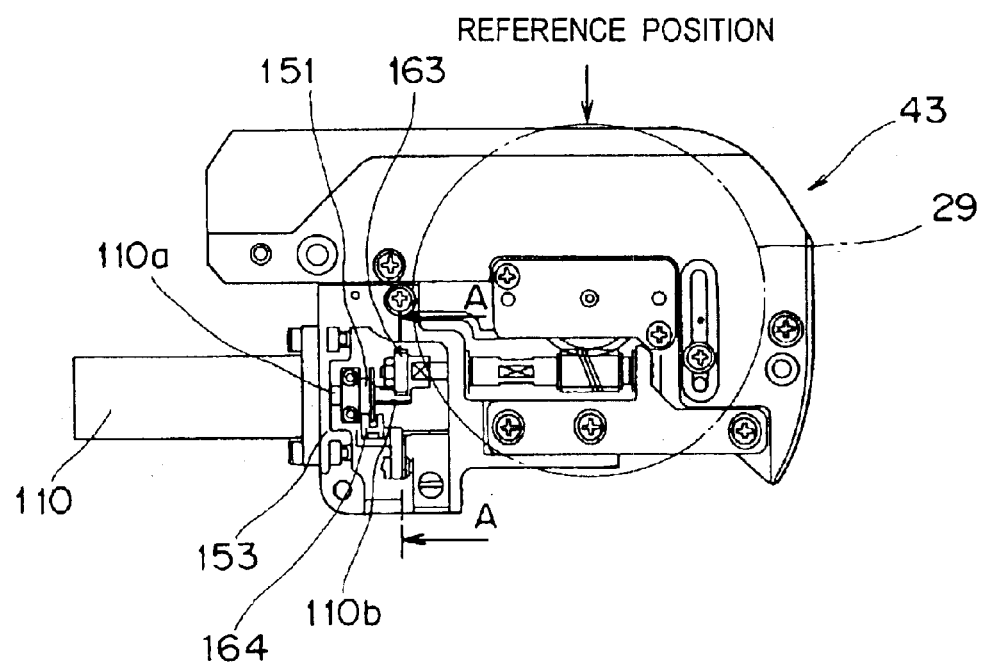
FIG. 9 is a side view of the tape sending mechanism with a drive motor being mounted thereon among explanational views showing adjustment procedures after the drive motor is replaced in the tape sending mechanism of the electronic component feeding apparatus shown in FIG. 1.
Figure 10:
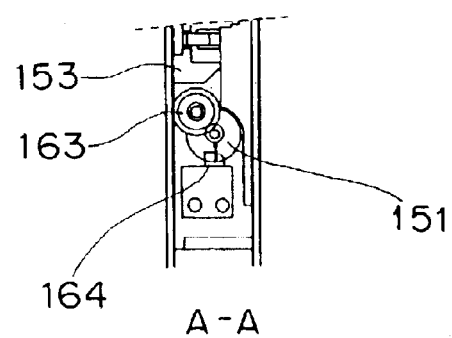
FIG. 10 is a cross sectional view taken along line A—A of FIG. 9.

Next, in a case of mounting a new drive motor 110 onto the tape sending mechanism 43, mounting is performed in reverse order of the dismounting procedures of the drive motor 110. After the drive motor 110 is mounted onto the frame 153 of the tape sending mechanism 43 such that the gear part 110b of the drive motor 110 engages with the gear part 163, the tape sending mechanism 43 is mounted on the apparatus mainframe 42. After that, as shown in FIG. 9, a center of a mounting reference position of the wheel 29 in the tape sending mechanism 43 is aligned with a center of a mounting reference position of the apparatus mainframe 42. Then, as shown in FIG. 10, a mounting position of the slit plate for sensor 151 is adjusted so that a peripheral portion of the slit plate for sensor 151 can pass inside the slit portion of the rotational speed measuring sensor 164 without making any contact therewith, by which a replacement operation of the drive motor 110 in the tape sending mechanism 43 is completed.

According to the first embodiment, various effects as shown below may be obtained.

First, both the drive motor 110 of the tape sending mechanism 43 and each drive motor 105 of the twist transportation mechanism 89 in the electronic component feeding apparatus 41 are to be brushless motors instead of DC motors (with brushes) or stepping motors, or either one of the drive motor 110 in the tape sending mechanism 43 and the drive motor 105 in the twist transportation mechanism 89 is to be a brushless motor instead of a DC motor (with brush) or stepping motor, which makes it possible to avoid wear of components due to contact with a brush in each drive motor. In a case of the brushless motor for example, since the brushless motor has a life of approximately 10000 to 50000 operating hours, it becomes possible to drastically reduce replacement frequency due to wear of each drive motor, implement good maintainability in the electronic component feeding apparatus, and improve productivity in the electronic component mounting apparatus equipped with the electronic component feeding apparatus.

In replacement of the drive motor 110, in the case of the tape sending mechanism 43 which particularly requires time and effort for dismounting and fine adjustment of components, a brushless motor is used as the drive motor 110, whereas in the case of the twist transportation mechanism 89 whose time and labor for replacement of the drive motor 105 are relatively smaller than those of the tape sending mechanism 43, there is used as the drive motor 105 a stepping motor, which is less expensive than the brushless motor and which has longer life than a DC motor (with brush). This makes it possible to improve maintainability of the electronic component feeding apparatus while reducing manufacturing costs, thereby enabling increase of productivity in the electronic component mounting apparatus equipped with the electronic component feeding apparatus.

Also, unlike the conventional electronic component feeding apparatus for collecting stripped-off cover tape 11 by taking the stripped-off cover tape up onto a cover tape take-up reel of a cover collecting mechanism in the electronic component feeding apparatus, the electronic component feeding apparatus 41 is provided with the twist transportation mechanism 89 for twisting the cover tape 11 stripped by the cover stripping-off mechanism 45, by which the stripped-off cover tape 11 may be sent by virtue of the second sending roller 103 to the tape discharge port 51, and therefore the cover tape 11 may be collected outside the electronic component feeding apparatus 41. Therefore, if a take-up quantity of the cover tape 11 is increased, a large load is put on the drive motor as with a conventional drive motor that rotates a cover take-up reel, but unlike the conventional drive motor for rotating the cover tape take-up reel, a load put on the drive motor 105 for rotating the second sending roller 103 in the twist transportation mechanism 89 may be kept stable all the time regardless of a sending amount of the cover tape 11. This makes it possible to elongate life of the drive motor 105, reduce motor replacement frequency, implement good maintainability of the electronic component feeding apparatus, and increase productivity in the electronic component mounting apparatus equipped with the electronic component feeding apparatus.

Along therewith, since collection of the cover tape 11 in the conventional electronic component feeding apparatus has been performed by taking up the cover tape 11 onto the cover tape take-up reel, it is necessary to dismount the cover tape take-up reel, onto which the cover tape 11 is taken up, from the electronic component feeding apparatus. However, in the electronic component feeding apparatus 41, the cover tape 11 is discharged from the tape discharge port 51 and collected outside the electronic component feeding apparatus 41, which makes it possible to eliminate a conventional operation of dismounting the cover tape take-up reel, thereby enabling improvement of workability in the electronic component mounting apparatus and enabling increase of productivity in the electronic component mounting apparatus equipped with the electronic component feeding apparatus.

Also, in the twist transportation mechanism 89 constituting the cover collecting mechanism 47, an axial length of the first and the second sending rollers 102, 103, for transporting the cover tape 11 in the state of being twisted, is larger than a maximum value of the width of the cover tape 11 to be handled. Consequently, even if tape widths of the carrier tape 13 and the cover tape 11 of the taping component 3 are changed, change of the first and the second sending rollers 102, 103 is not necessary. Through common use of components such as the sending rollers 102, 103 in the twist transportation mechanism 89, apparatus costs of the electronic component feeding apparatus may be reduced, thereby enabling reduction of mounting costs of electronic components and increase of productivity in the electronic component mounting apparatus equipped with the electronic component feeding apparatus.

Also in the electronic component feeding apparatus 41, since dead carrier tape 13 and the cover tape 11 are both discharged from the common tape discharge port 51, collection of this carrier tape 13 and cover tape 11 is achieved by providing single equipment such as a collecting box on the tape discharge port 51, and therefore it is not necessary to separately provide collecting equipment for the carrier tape 13 and the cover tape 11.

As a result, simplifying equipment for collecting dead cover tape 11 and the carrier tape 13 makes it possible to reduce apparatus costs of the electronic component feeding apparatus through reduction of the number of components and the like, which fulfills reduction of mounting costs of the electronic components and increase of productivity in the electronic component mounting apparatus equipped with the electronic component feeding apparatus.

Further, in the electronic component feeding apparatus 41, the tape discharge port 51 is opened downwardly on a lower face of the apparatus mainframe 42, so that the cover tape 11 and the carrier tape 13 descend downwardly to the tape discharge port 51 by one's own weight by gravitation. Consequently, with a simple constitution of disposing a collecting box on a lower side of the tape discharge port 51, both tapes may be collected. Through simplification of a mechanism of the collecting equipment and promotion of labor savings by decrease in the number of drive motors in use, reduction of apparatus costs in the electronic component feeding apparatus may be further promoted, thereby enabling increase of productivity in the electronic component mounting apparatus equipped with the electronic component feeding apparatus.

Also, in the electronic component feeding apparatus 41, the reel support frame 75 is capable of swinging between the support position and the detachment position. Accordingly, in a case where replacement of taping component 3 is necessary, swinging the reel support frame 75 that supports the component housing reel to the detachment position makes it possible to move the component housing reel to a position where component housing reels 7 of other adjacent electronic component feeding apparatuses do not become obstructive, which enables replacement of component housing reel 7; that is, replacement of the taping component 3, without stopping operation of other adjacent electronic component mounting apparatuses.

Therefore, in a case where a plurality of electronic component mounting apparatuses are adjacently disposed in parallel, replacement of taping component 3 in an electronic component feeding apparatus in an arbitrary electronic component mounting apparatus may be easily conducted without stopping operation of other adjacent electronic component mounting apparatuses, which brings about an increased operating ratio of the electronic component mounting apparatus, resulting in increase of productivity.

Also in the electronic component feeding apparatus 41, the cover 55 for covering the component pickup port 63a to prevent electronic component 19 from falling, when the electronic component feeding apparatus is not installed in the electronic component mounting apparatus, is always pressed by the spring 85a incorporated in the actuator 85 in a direction of covering the component pickup port 63a. The cover 55 puts the component pickup port 63a in an open state only when the electronic component feeding apparatus 41 is installed in the electronic component mounting apparatus. Therefore, at a time of moving the electronic component feeding apparatus 41 in a state of being dismounted from the electronic component mounting apparatus, falling of electronic components from the component pickup port 63a may be reliably prevented.

Furthermore, the cover 55 is structured such that a shift thereof in the direction of opening the component pickup port 63a is adjustable by the drive mechanism 81 so as to enable change in a size of the opening in accordance with size of respective electronic components. This enables a single kind of cover 55 to support change in the size of electronic components and the like, and therefore it is not necessary to prepare various kinds of covers 55 with different sizes for the size change of electronic component 19.

Therefore, common use of the cover 55 and increase of reliability to prevent falling of the electronic component 19 implement good workability of the electronic component feeding apparatus and increase of productivity in the electronic component mounting apparatus equipped with the electronic component feeding apparatus.

It may be understood that the specific constitution of the cover stripping-off mechanism, the cover collecting mechanism and the tape sending mechanism in the present invention is not limited to the constitution disclosed in the above embodiment, but is naturally capable of appropriate modifications without departing from the spirit of the present invention.

Also, in the above embodiment, as the drive motor 110 of the tape sending mechanism 43 and the drive motor 105 of the cover collecting mechanism 47, a brushless motor is adopted. However, a brushless motor may also be used as a drive motor for use in other members according to circumstances.

Figure 11:
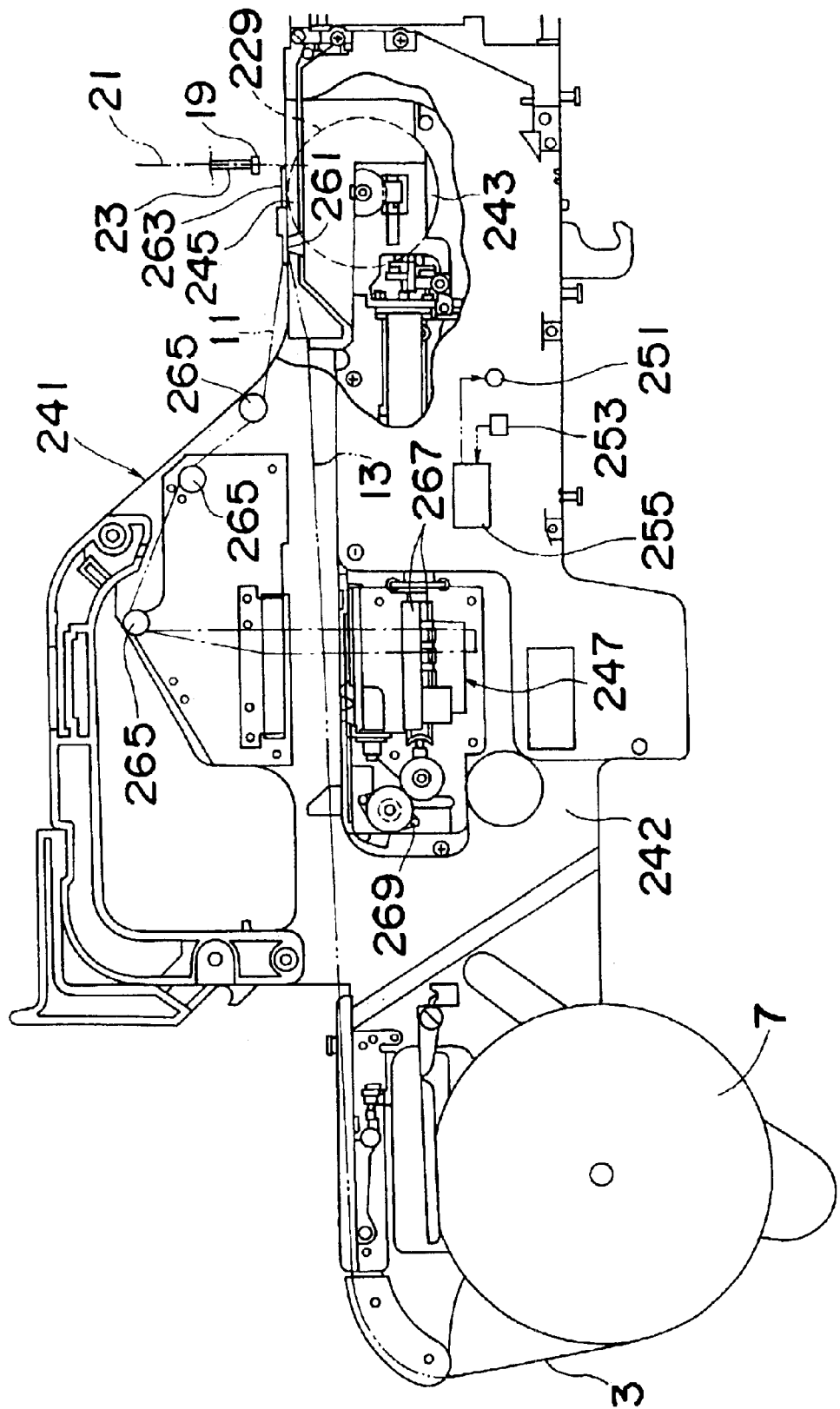
FIG. 11 is a right side view showing an electronic component feeding apparatus in a second embodiment of the present invention.
Figure 12:
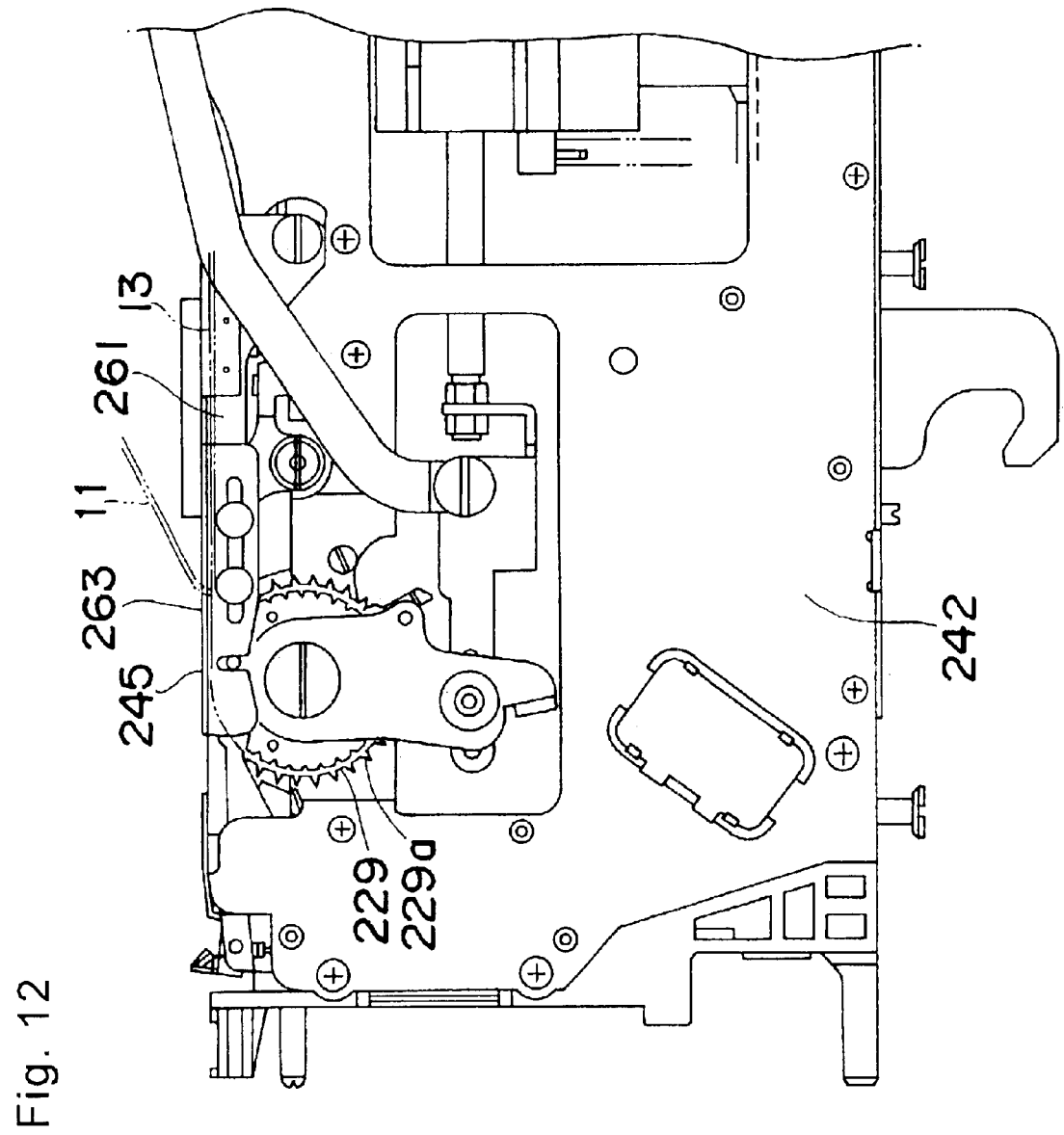
FIG. 12 is a left side view showing a shutter portion of the electronic component feeding apparatus shown in FIG. 11.
Figure 13:
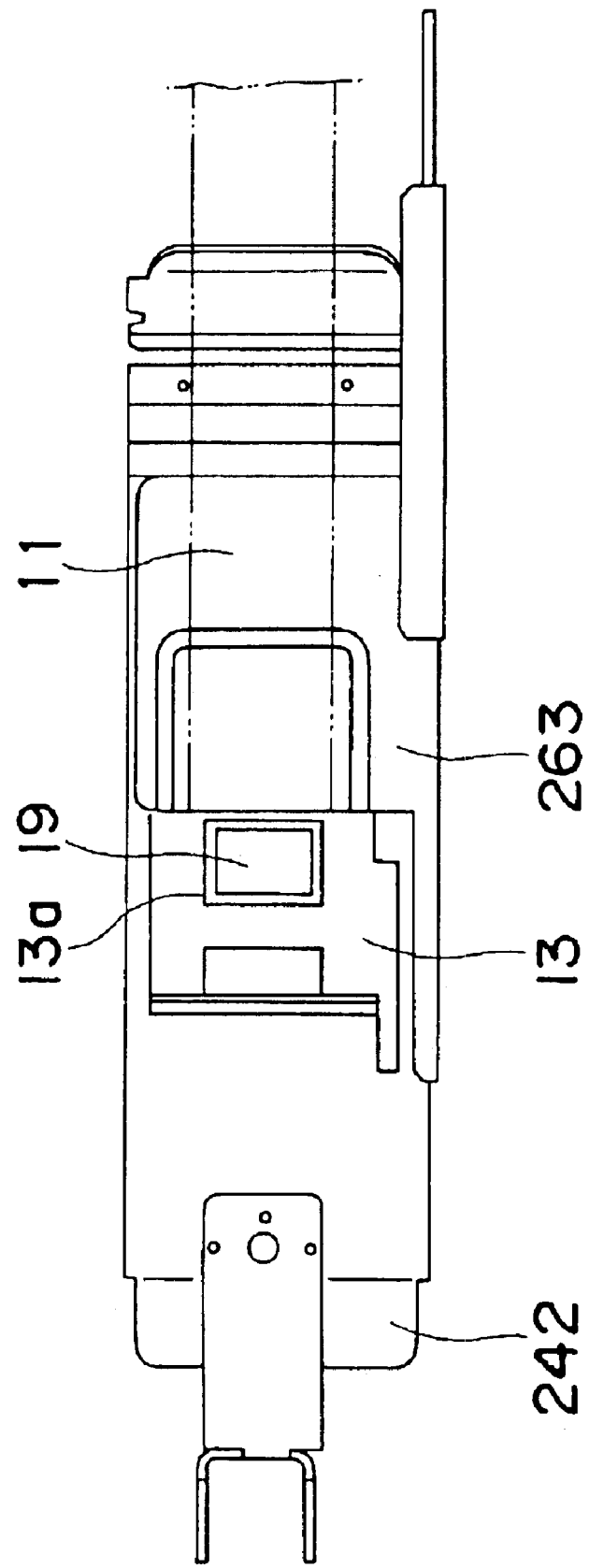
FIG. 13 is a plan view showing the shutter portion shown in FIG. 12.
Figure 14:
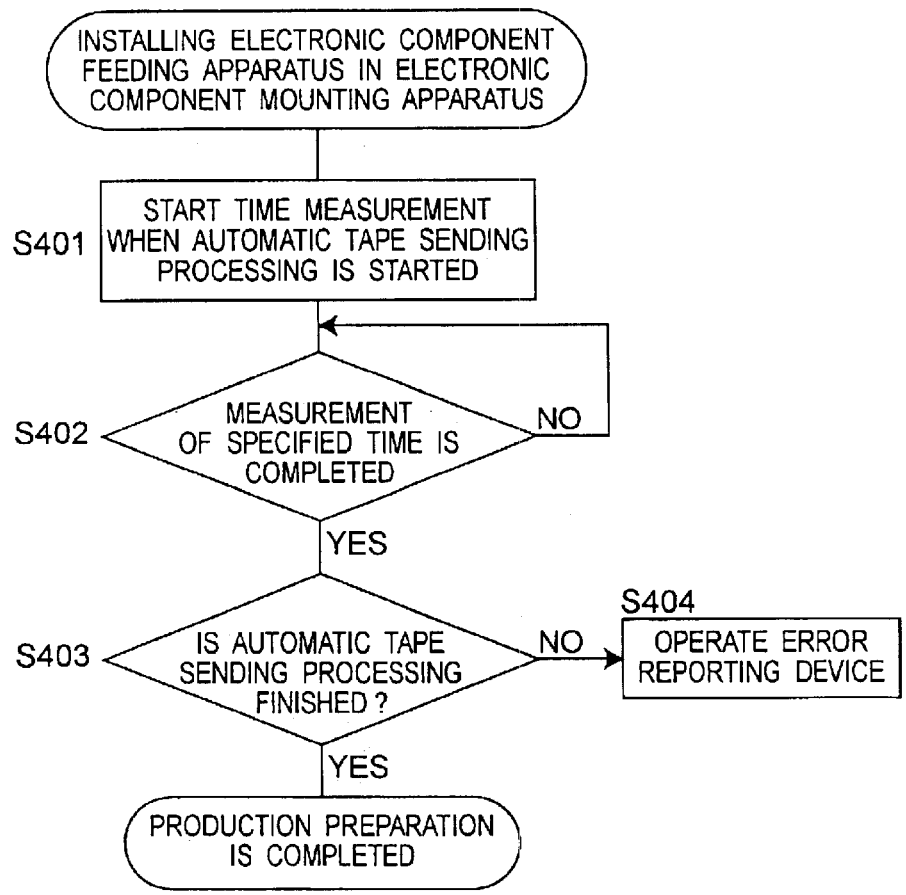
FIG. 14 is a schematic view showing initial processing executed by a control portion of the electronic component feeding apparatus shown in FIG. 11.

It may be understood that the present invention is not limited to the above embodiment, but may be embodied in various other ways. For example, a second embodiment of the electronic component feeding apparatus in the present invention is shown in FIG. 11 to FIG. 14, in which FIG. 11 is a right side view showing an electronic component feeding apparatus in the second embodiment of the present invention, FIG. 12 is a left side view showing a shutter portion of the electronic component feeding apparatus shown in FIG. 11, FIG. 13 is a plan view showing the shutter portion shown in FIG. 12, and FIG. 14 is a schematic view showing initial processing executed by a control part of the electronic component feeding apparatus shown in FIG. 11.

Electronic component feeding apparatus 241 in the second embodiment comprises: a component housing reel 7 disposed on one end of an apparatus mainframe 242 for winding and housing a taping component 3 that is composed of a carrier tape 13, for incorporating electronic components 19 in upper-side recess portions 13a, and a cover tape 11 attached thereto for covering the recess portions 13a; a tape sending mechanism 243 for sending the taping component 3 pulled from the component housing reel 7 by a constant length along a transportation route; a cover stripping-off mechanism 245 for stripping the cover tape 11 from the carrier tape 13 of the taping component 3 sent by the tape sending mechanism 243 in a specified position in the transportation route of the taping component 3; and a cover collecting mechanism 247 for serially sending the cover tape 11 stripped by the cover stripping-off mechanism 245 to a collection position.

The component housing reel 7 and the taping component 3 have a constitution identical to that of the electronic component feeding apparatus of a prior art and the first embodiment.

Tape sending mechanism 243, providing a constant rate of rotational driving to a wheel 229, as one example of a first rotary member, having engagement hooks 229a for engaging with engagement holes 13b of the carrier tape 13, that are provided on a periphery at constant pitches, transports the taping component 3 by a constant amount.

A component pickup position 21 of the electronic component mounting apparatus is set in the vicinity where the engagement hooks 229a of the wheel 229 fit into the engagement holes of the carrier tape 13, and the electronic component mounting apparatus has a suction nozzle 23 for sucking electronic component 19 by vacuum suction force at the component pickup position 21.

Figure 31:
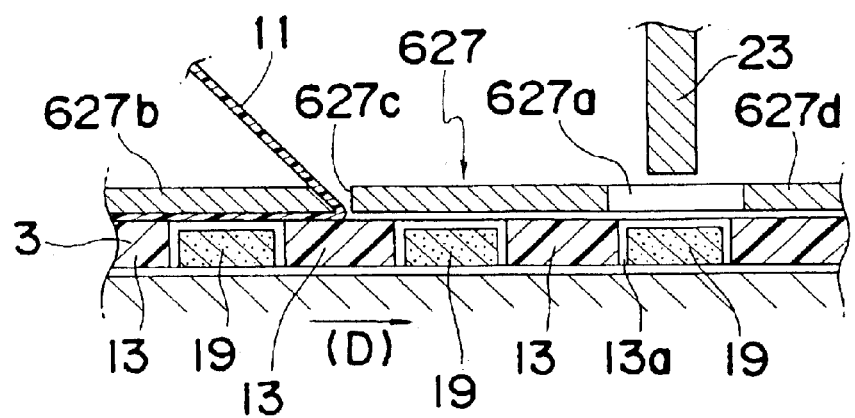
FIG. 31 is an enlarged cross sectional view showing the vicinity of a component pickup position in the electronic component feeding apparatus shown in FIG. 27.

In the vicinity of the component pickup position 21, there is provided a tape pressing member 263 for positioning the taping component 3 by pressing the taping component 3 to a specified tape transportation face 261. The tape pressing member 263 is provided with a stripping portion serving as the cover stripping-off mechanism 245 for stripping the cover tape 11 from the carrier tape 13. The tape pressing member 263 has a constitution identical to shutter 627 shown in FIG. 31.

The cover tape 11 stripped from the carrier tape 13 by the cover stripping-off mechanism 245 is led to a cover sending roller 267, that exemplifies a second rotary member in the cover collecting mechanism 247, via a positioning roller 265, and sent by the cover sending roller 267.

The cover sending roller 267 is rotatively driven by a drive motor 269, exemplifying a second drive motor, in unison with a sending operation of the taping component 3 by the tape sending mechanism 243 and with a stripping-off operation of the cover tape 11 by the cover stripping-off mechanism 245 for sequentially sending the cover tape 11 stripped from the carrier tape 13.

In addition to the above constitution, the electronic component feeding apparatus 241 in the second embodiment is additionally provided with: an operation monitoring sensor 253, exemplifying an operation monitoring device, for outputting an operational monitoring signal of the sending operation of the taping component 3 or the sending operation of the cover tape 11; an error reporting part 251, exemplifying an error reporting device, for reporting sending failure of the taping component 3 in the electronic component feeding apparatus 241; and a control part 255 for executing specified initial processing upon reception of power feed from an electronic component mounting apparatus when the electronic component feeding apparatus 241 is installed in the electronic component mounting apparatus.

Also, the control part 255, which is provided inside the apparatus mainframe 242, executes automatic tape sending processing as initial processing for outputting an operational control signal to the tape sending mechanism 243, the cover stripping-off mechanism 245, or the cover collecting mechanism 247 so that the electronic component 19 exposed on the carrier tape 13 is positioned at the component pickup position, and executes, based on the operational monitoring signal inputted by the operation monitoring sensor 253 during execution of the automatic tape sending processing, error reporting processing for determining error in the sending operation of the taping component 3 or error in the sending operation of the cover tape 11 as a sending failure of the taping component 3, and for operating the error reporting part 251 upon determination of the sending failure.

Also, the control part 255, upon determining that sending of the taping component 3 is a failure, operates the error reporting part 251 to execute error reporting processing, and also executes error reporting processing for reporting an error to an operation screen of the electronic component mounting apparatus.

It is noted that in the second embodiment, the operation monitoring sensor 253 is a timer for measuring time required for automatic tape sending processing, and the error reporting part 251 is provided with an alarm lamp for indicating an error by lighting.

The control part 255 monitors required time measured by the timer based on an operation monitoring signal inputted by the timer, and upon determining that a sending operation performed by motor 269 is not completed within a specified time, the control part 255 determines a sending failure of the taping component 3 on an assumption that the automatic tape sending processing is not normally completed, and lights the alarm lamp provided in the error reporting portion 251.

More particularly, as shown in FIG. 14, when the electronic component feeding apparatus 241 is installed in an electronic component mounting apparatus, as soon as the automatic tape sending processing is started by each of the mechanisms 243, 245, and 247, the timer as the operation monitoring sensor 253 begins measuring required time (step S401). When a specified time is lapsed, it is determined whether or not the sending operation of the motor 269 in the cover collecting mechanism 247 is completed (step S402, S403). If the sending operation performed by the motor 269 is not completed, it is determined that normal automatic tape sending processing is not completed, and a sending failure of the taping component 3 is determined, as a result of which the alarm lamp provided in the error reporting part 251 is lit (step S404).

It is noted that the error reporting portion 251 may report other errors, such as input power source variation error, operation instruction signal error, sending amount switch error, operation monitoring sensor disconnected error, and an offset amount error in offsetting wheel 229 stopping position in the electronic component feeding apparatus 241.

According to the second embodiment, in the electronic component feeding apparatus 241, when the electronic component feeding apparatus 241 is installed in the electronic component mounting apparatus, initial processing is automatically executed by the control part 255 provided in the electronic component feeding apparatus 241, which enables an operator to detect occurrence of a sending failure of a taping component without going to an operational portion of the electronic component mounting apparatus.

Therefore, it is not necessary to go to the operational portion of the electronic component mounting apparatus every time the taping component 3 needs replacement, which leads to improvement of workability and an operating ratio of the electronic component mounting apparatus equipped with the electronic component feeding apparatus, thereby implementing increased productivity in the electronic component mounting apparatus.

Further, like the second embodiment, in a constitution where there is provided a timer for measuring time required for performing the automatic tape sending processing as the operation monitoring sensor 253, and upon determining that the automatic tape sending processing is not completed within a specified time, the control part 255 determines a sending failure of the taping component. Consequently, the operation monitoring sensor 253 is fulfilled by relatively inexpensive components, which enables reliable detection of a sending failure of the taping component and fulfillment of the object of the invention at low costs, thereby implementing increased productivity in the electronic component mounting apparatus equipped with the electronic component feeding apparatus.

Figure 15:
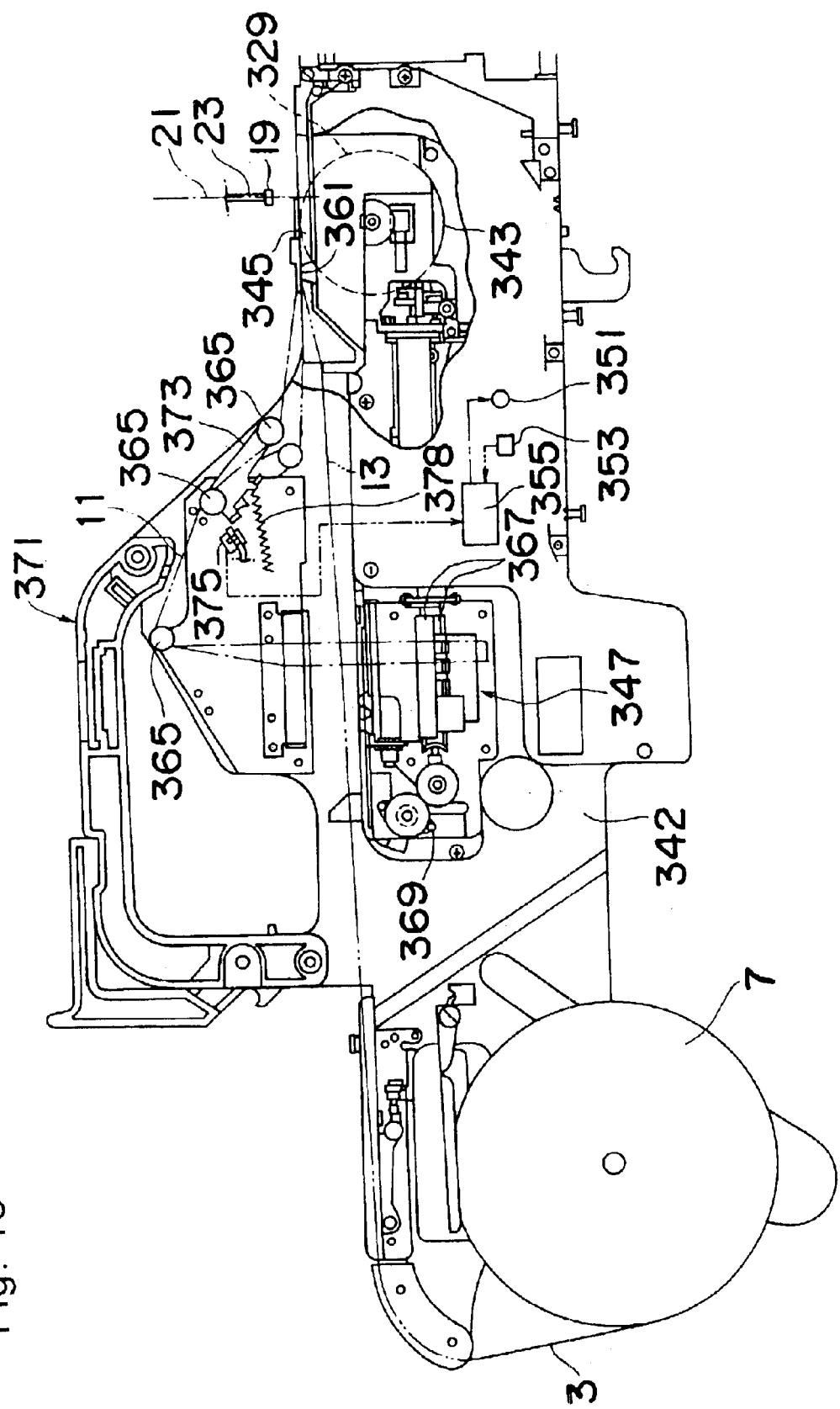
FIG. 15 is a right side view showing an electronic component feeding apparatus in a third embodiment of the present invention.
Figure 16:
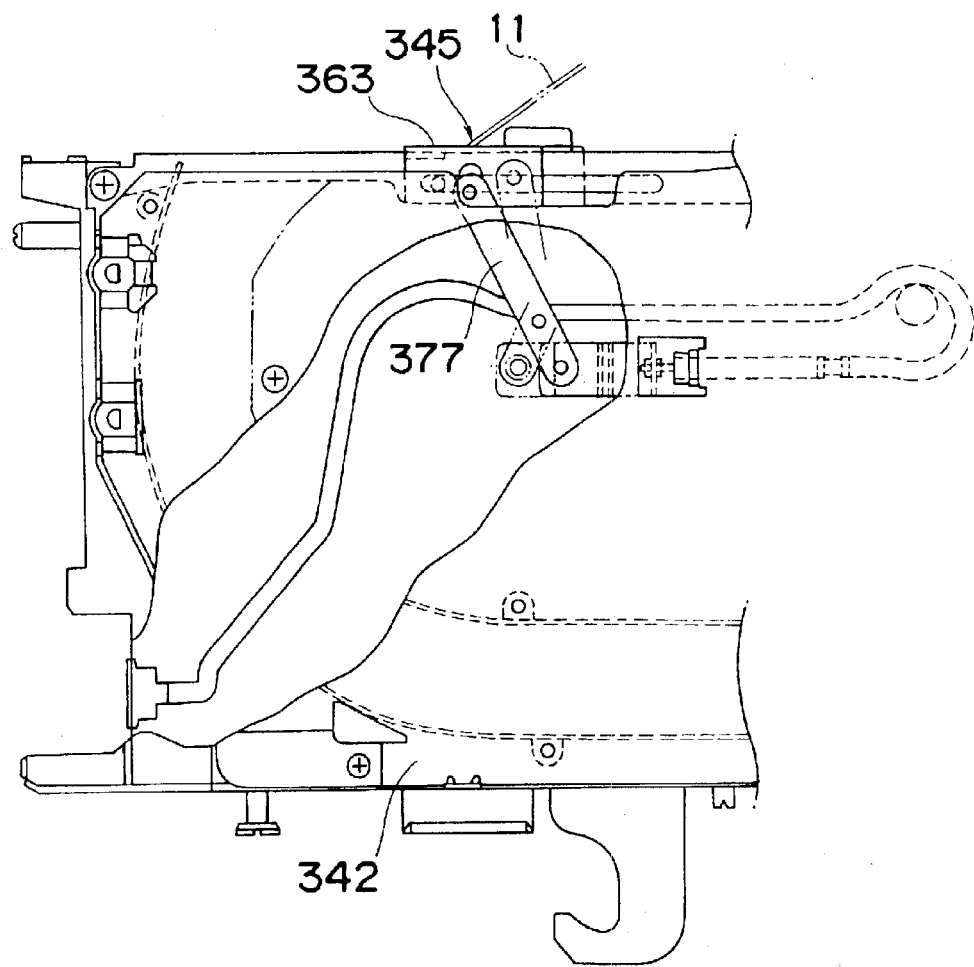
FIG. 16 is a left side view showing a shutter portion of the electronic component feeding apparatus shown in FIG. 15.
Figure 17:
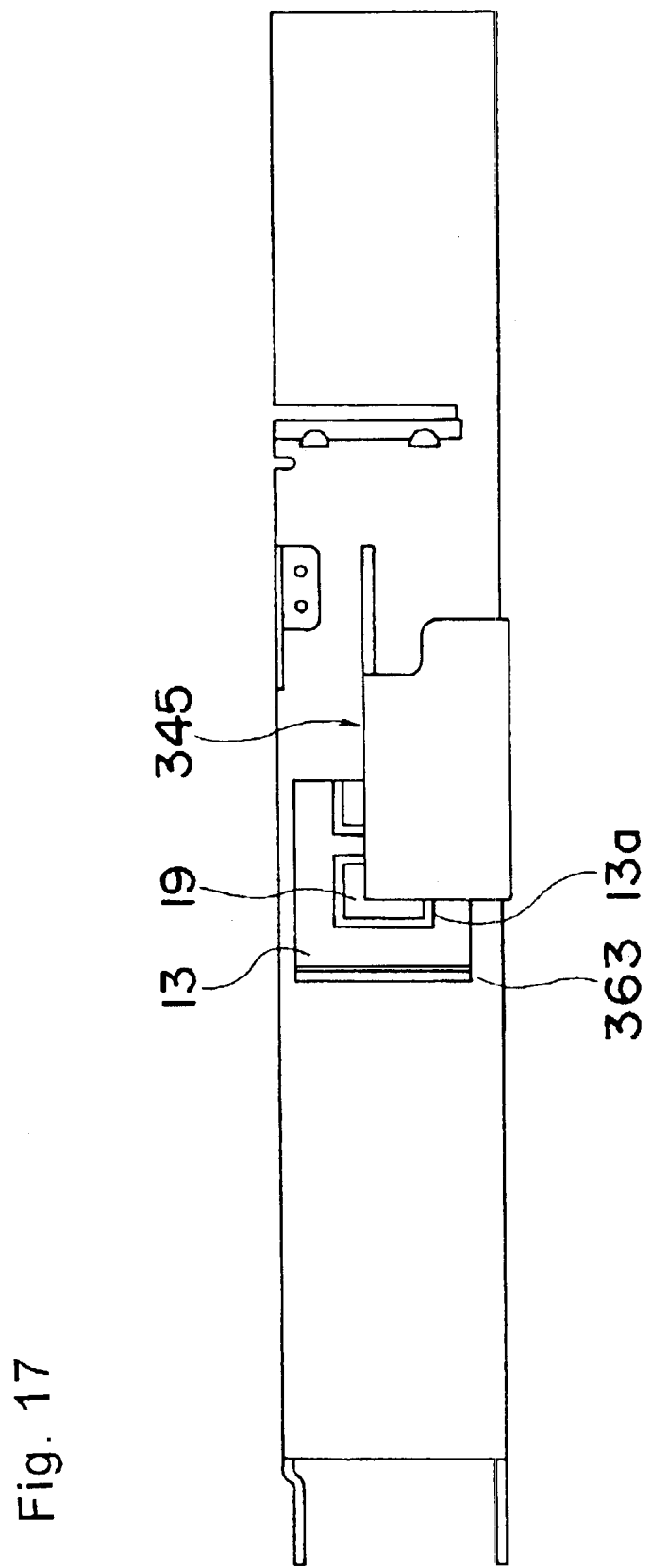
FIG. 17 is a plan view showing the shutter portion shown in FIG. 16.
Figure 18:
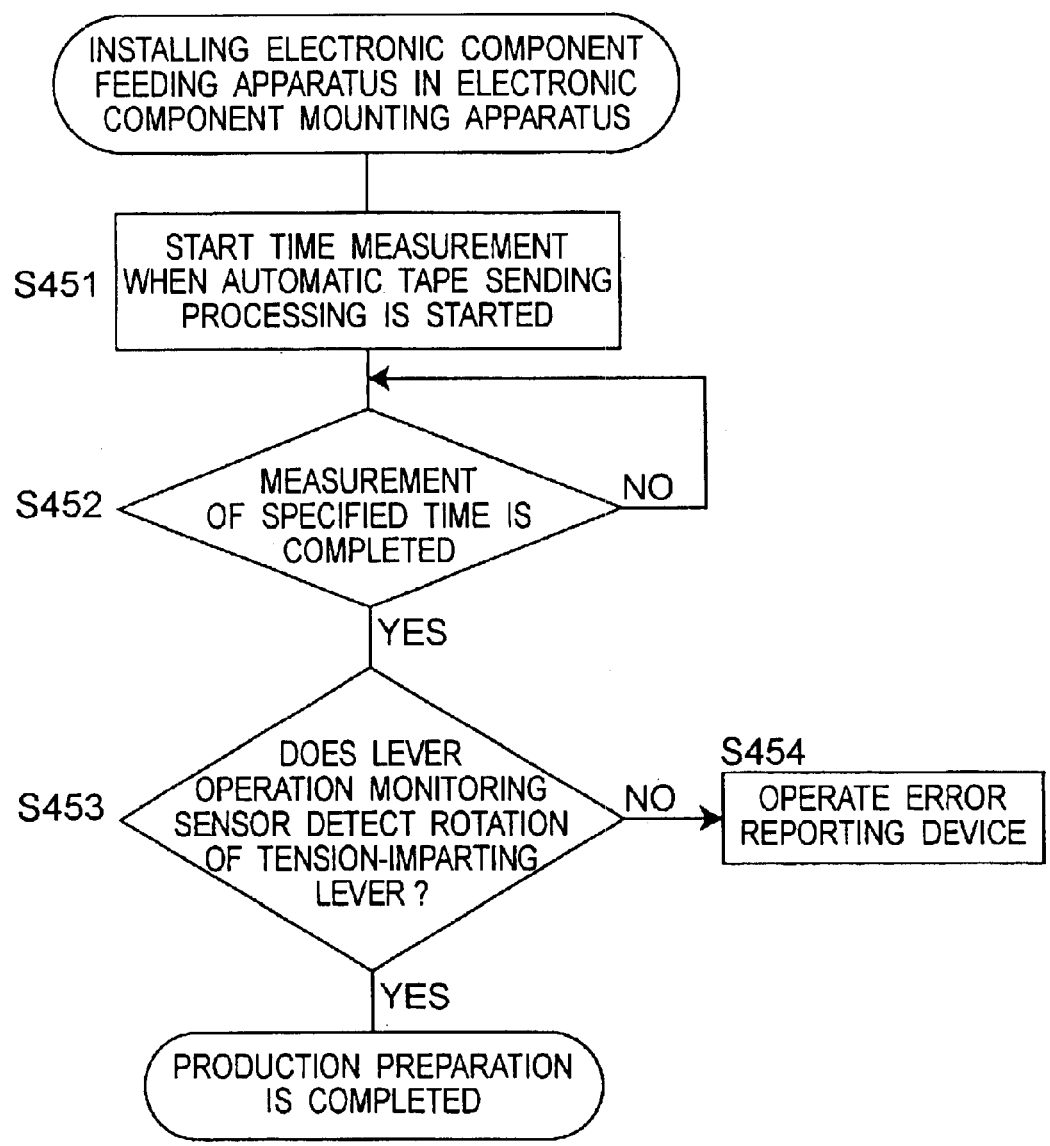
FIG. 18 is a schematic view showing initial processing executed by a control part of the electronic component feeding apparatus shown in FIG. 15.
Figure 19:
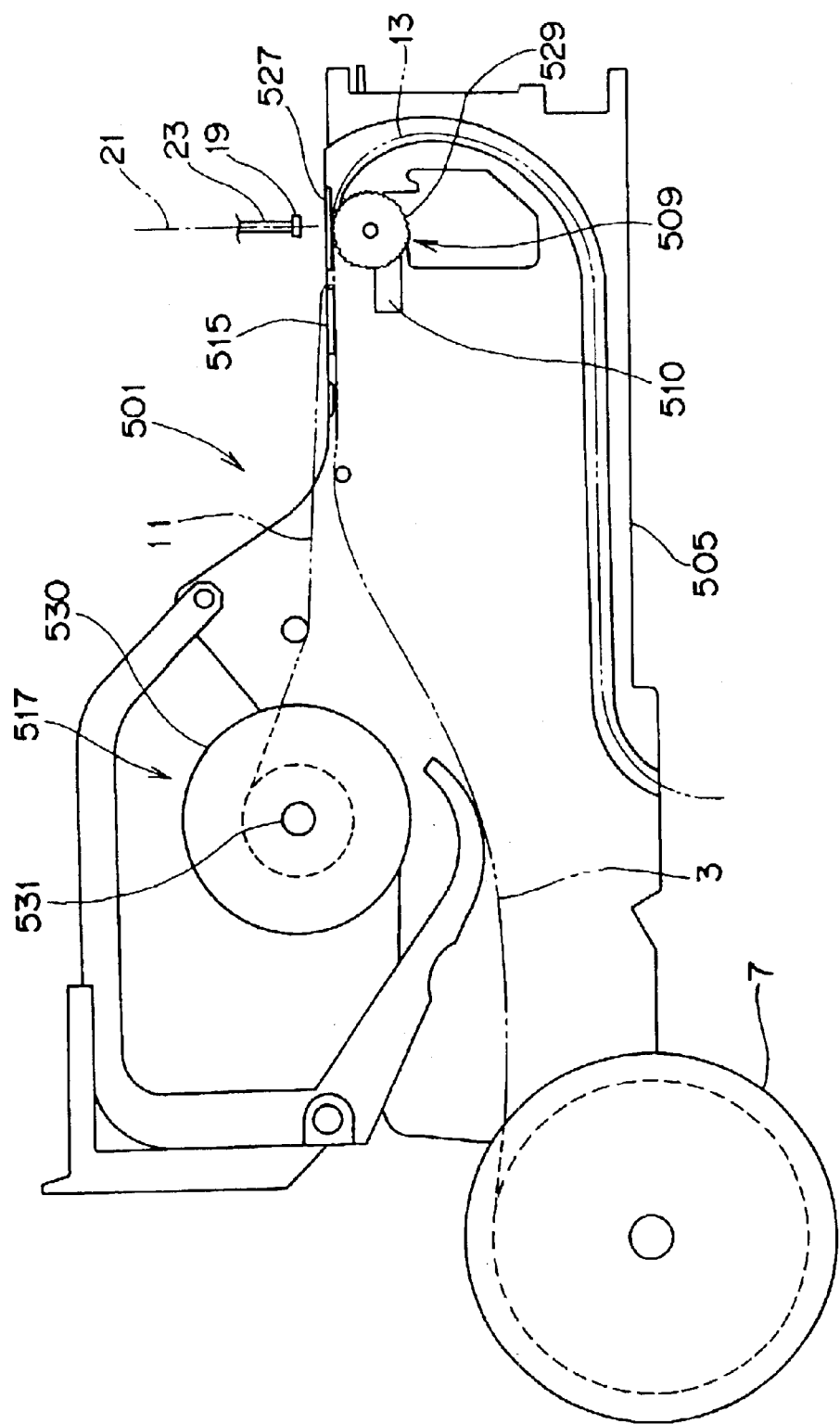
FIG. 19 is a left side view showing a conventional electronic component feeding apparatus.
Figure 20:
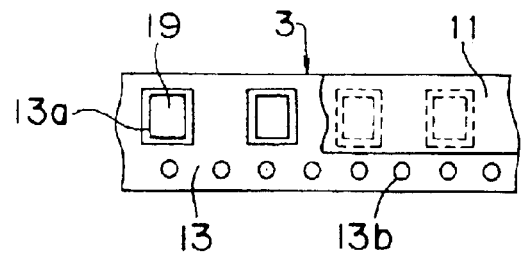
FIG. 20 is a plan view showing a constitution of a taping component set in the electronic component feeding apparatus shown in FIG. 19.
Figure 21:
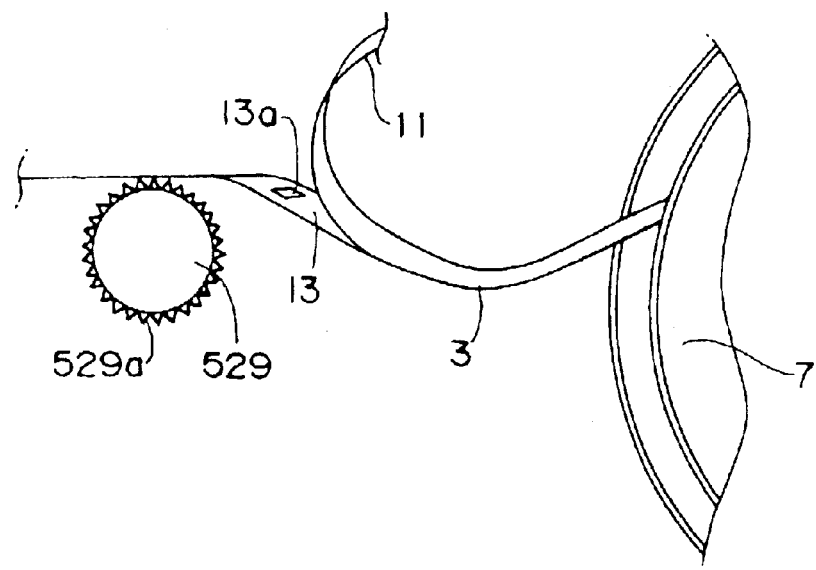
FIG. 21 is a schematic constituent view showing a tape sending mechanism of the electronic component feeding apparatus shown in FIG. 19.

Next, a third embodiment of the electronic component feeding apparatus of the present invention is shown in FIG. 15 to FIG. 18, in which FIG. 15 is a right side view showing the electronic component feeding apparatus in the third embodiment of the present invention, FIG. 16 is a left side view showing a shutter portion of the electronic component feeding apparatus shown in FIG. 15, FIG. 17 is a plan view showing the shutter portion shown in FIG. 16, and FIG. 18 is a schematic view showing initial processing executed by a control part of the electronic component feeding apparatus shown in FIG. 15.

Electronic component feeding apparatus 371 of the third embodiment is a partially modified electronic component feeding apparatus 241 shown in the second embodiment.

Also, the electronic component feeding apparatus 371 of the third embodiment is provided with a tension-imparting lever 373 for imparting tension to cover tape 11 along a route of the cover tape 11 from a cover stripping-off mechanism 345 to a cover collecting mechanism 347, and a lever operation monitoring sensor 375 for monitoring rotational operation of the tension-imparting lever 373.

As shown in FIG. 16 and FIG. 17, a tape pressing member 363 of the cover stripping-off mechanism 345 is modified to be structured to perform a reciprocating operation necessary for sending taping component 3 and stripping-off the cover tape 11 by swinging of a link 377.

The tension-imparting lever 373, which is structured such that a base end is mounted on a center of a positioning roller 365 that is in contact with the cover tape 11 so as to swing, and a top end is provided with another positioning roller 365 that comes into contact with the cover tape 11 from an opposite side to the base end side's positioning roller 365, is pressed in one direction by a spring 378 so as to provide tension to the cover tape 11 for enabling a smooth sending of the cover tape 11 and enabling removal of sagging of the cover tape 11.

When a sending operation is conducted by the cover collecting mechanism 347, the tension-imparting lever 373 performs a rotational operation in a direction against the spring 378.

The lever operation monitoring sensor 375 is a sensor for monitoring if the tension-imparting lever 373 performs a specified amount of the rotational operation in conjunction with the sending operation of the cover collecting mechanism 347 during execution of automatic tape sending processing, and exemplifies an operation monitoring device.

More specifically, the lever operation monitoring sensor 375 outputs a constant signal as an operation monitoring signal to a control part 355 when the tension-imparting lever 373 performs the specified amount of rotational operation in response to the sending of the cover tape 11 during execution of the automatic tape sending processing.

As shown in FIG. 18, the control part 355 starts time measurement by virtue of a timer when the automatic tape sending processing is started (step S451), and when the lever operation monitoring sensor 375 inputs a signal informing that the rotational operation is executed within specified time, the control part 355 determines that sending of the taping component 3 is normal. If the signal is not inputted by the lever operation monitoring sensor 375 within the specified time, the control part 355 determines a sending failure of the taping component 3 (step S452, S453), and operates an error reporting part 351 (step S454).

It is noted that in the error reporting part 351, it is possible to classify an error into three types according to types of error to be reported, i.e. error relating to sending of the taping component 3; error relating to the cover tape 11; and error relating to the control part and the like, and to identify the type of error by a blinking amount of an alarm lamp provided in the error reporting part 351.

According to the third embodiment, when the electronic component feeding apparatus 371 is installed in an electronic component mounting apparatus, initial processing is automatically executed by the control part 355 provided in the electronic component feeding apparatus 371, which enables an operator to detect occurrence of a sending failure of a taping component without going to an operational portion of the electronic component mounting apparatus.

Therefore, it is not necessary to go to the operational portion of the electronic component mounting apparatus every time taping component 3 needs replacement, which leads to improvement of workability and an operating ratio of the electronic component mounting apparatus equipped with the electronic component feeding apparatus, thereby implementing increased productivity in the electronic component mounting apparatus.

Further, like the third embodiment, in a constitution where there is provided the lever operation monitoring sensor 375, as an example of the operation monitoring device for monitoring a normal sending operation of the cover tape 11 attained by rotational operation of the tension-imparting lever 373, the operation monitoring device is fulfilled with relatively inexpensive components, which enables reliable detection of a sending failure of a taping component and fulfillment of the object of the present invention at low costs.

According to the first aspect, using a brushless motor as the first drive motor for rotating the first rotary member that sends the taping component in the tape sending mechanism makes it possible to avoid wear of the components in the first drive motor due to, for example, contact friction with a brush as with a conventionally-used DC motor (with brush) or a stepping motor. This makes it possible to reduce replacement frequency of the first drive motor in the tape sending mechanism due to wear, implement good maintainability in the electronic component feeding apparatus, and improve productivity in the electronic component mounting apparatus equipped with the electronic component feeding apparatus.

Also, the cover collecting mechanism collects the stripped-off cover tape not by winding the stripped-off cover tape onto the rotary member rotated by the drive motor, but only by sequentially sending the cover tape to the collection position in a collectable manner by operation of the second drive motor. Consequently, without putting a large load on the drive motor due to increase of a take-up amount of the cover tape onto the rotary member, it becomes possible to keep the load on the second drive motor stable all times regardless of a sending amount of the cover tape by the second rotary member, which makes it possible to elongate life of the second drive motor in the cover collecting mechanism, reduce replacement frequency, implement good maintainability of the electronic component feeding apparatus, and increase productivity in the electronic component mounting apparatus equipped with the electronic component feeding apparatus.

Along therewith, in collection of the cover tape, it becomes possible to eliminate labor associated with dismounting the rotary member, onto which the cover tape is wound, from the electronic component feeding apparatus, thereby enabling improvement of workability of the electronic component feeding apparatus and enabling increase of productivity in the electronic component mounting apparatus equipped with the electronic component feeding apparatus.

Also, in replacement of the drive motor, in the case of the tape sending mechanism which particularly requires time and effort for dismounting and fine adjustment of the components, a brushless motor is used as the first drive motor, whereas in the case of the cover collecting mechanism whose time and labor for replacement of the drive motor are relatively smaller than those of the tape sending mechanism, a stepping motor is used as the second drive motor, which is less expensive than the brushless motor and which has longer life than a DC motor (with brush). This makes it possible to improve maintainability of the electronic component feeding apparatus while reducing manufacturing costs, thereby enabling increase of productivity in the electronic component mounting apparatus equipped with the electronic component feeding apparatus.

According to the second aspect of the present invention, in addition to the effect obtained in the first aspect, using a brushless motor as the second drive motor in the cover collecting mechanism further makes it possible to avoid wear of the components due to contact friction with the brush, as with a conventionally-used DC motor (with brush) or a stepping motor, also in the second drive motor. This achieves reduced replacement frequency of the second drive motor in the cover collecting mechanism due to wear, good maintainability in the electronic component feeding apparatus, and improved productivity in the electronic component mounting apparatus equipped with the electronic component feeding apparatus.

According to the third aspect of the present invention, with the cover collecting mechanism capable of maintaining a load on the second drive motor stable at all times regardless of a sending amount of the cover tape by the second rotary member, it becomes possible to provide an electronic component feeding apparatus capable of obtaining an effect similar to the effect obtained by the first aspect or the second aspect even in a case where a central axial direction of rotation of the second rotary member in the cover collecting mechanism is approximately orthogonal to a central axial direction of rotation of the first rotary member in the tape sending mechanism.

According to the fourth aspect or the fifth aspect of the present invention, using a brushless motor as the second drive motor of the twist transportation mechanism in the cover collecting mechanism makes it possible to avoid wear of components due to contact friction with a brush. This makes it possible to remarkably reduce replacement frequency of the second drive motor in the cover collecting mechanism due to wear, and with reduced maintenance expense involving motor replacement and the like, productivity in the electronic component mounting apparatus equipped with the electronic component feeding apparatus may be increased.

According to the sixth aspect of the present invention, a length of the second rotary member in its axial direction is set larger than a maximum value of a width of the cover tape to be handled. Consequently, even if a width of the carrier tape and the cover tape of the taping component is changed, change of the second rotary member and the like for collection of the cover tape is not necessary. Further, through common use of components such as the second rotary member in the twist transportation mechanism, apparatus costs of the electronic component feeding apparatus may be reduced, thereby enabling reduction of mounting costs of electronic components and increase of productivity in the electronic component mounting apparatus equipped with the electronic component feeding apparatus.

According to the seventh aspect and the eight aspect of the present invention, collection of the stripped-off carrier tape and cover tape is achieved not by winding the stripped-off carrier tape and the cover tape in the electronic component feeding apparatus, but both of the stripped-off carrier tape and the cover tape are discharged from a common tape discharge port and collected outside of the electronic component feeding apparatus. Consequently, collection of this carrier tape and cover tape is achieved by providing single equipment such as a collecting box on the tape discharge port, and therefore it is not necessary to separately provide collecting equipment for the carrier tape and the cover tape.

As a result, simplifying equipment for collecting the stripped-off cover tape and the carrier tape makes it possible to reduce apparatus costs of the electronic component feeding apparatus through reduction of the number of components and the like, thereby fulfilling reduction of mounting costs of electronic components and increase of productivity in the electronic component mounting apparatus equipped with the electronic component feeding apparatus.

According to the ninth aspect of the present invention, for example, the stripped-off cover tape and carrier tape descend downwardly to the tape discharge port by one's own weight by gravitation. Consequently, with a simple constitution of disposing a collecting box on the lower side of the tape discharge port, both tapes may be collected. Simplifying the mechanism of the collecting equipment and promoting labor savings by decreased use of drive motors enables further increase of productivity in the electronic component mounting apparatus equipped with the electronic component feeding apparatus compared to the effect obtained by the seventh aspect or the eighth aspect.

According to the tenth aspect or the eleventh aspect of the present invention, with the electronic component feeding apparatus needing replacement of a taping component, the reel support member capable of supporting the component housing reel that houses the taping component in a state of being wound is made so as to swing between the detachment position and the support position of the component housing reel, so that the reel support member is swung to the detachment position. This makes it possible to move the component housing reel supported by the reel support member to a position where reel support members of other adjacent electronic component feeding apparatuses do not become obstructive, which enables replacement of the component housing reel (that is, replacement of the taping component), without stopping operation of other adjacent electronic component mounting apparatuses.

Therefore, in a case where a plurality of electronic component mounting apparatuses are adjacently disposed in parallel, replacement of the taping component in an electronic component feeding apparatus in an arbitrary electronic component mounting apparatus may be easily conducted without stopping operation of other adjacent electronic component mounting apparatuses, which brings about an increased operating ratio of the electronic component mounting apparatus, resulting in increase of productivity.

According to the twelfth aspect or the thirteenth aspect of the present invention, the cover for covering recess portions of a carrier tape at the component pickup port, to prevent an electronic component from falling when the electronic component feeding apparatus is not installed in the electronic component mounting apparatus, is always pressed by a pressing member in a direction of covering a recess portion of the carrier tape at the component pickup port. The cover puts the recess portion of the carrier tape positioned at the component pickup port in an open state only when the electronic component feeding apparatus is installed in the electronic component mounting apparatus. Therefore, at a time of moving the electronic component feeding apparatus in a state of being dismounted from the electronic component mounting apparatus, falling of electronic components from the recess portions of the carrier tape when positioned in the component pickup port may be reliably prevented.

Furthermore, the cover is structured such that a shift thereof to a direction of opening the recess portion of the carrier tape at the component pickup port is adjustable, so as to enable change in a size of the opening in accordance with size of respective electronic components. This enables a single kind of cover to support a change in size of electronic components and the like, and therefore it is not necessary to change the cover for covering the component pickup port.

Therefore, common use of the cover and increase of reliability to prevent falling of an electronic component implement good workability of the electronic component feeding apparatus and achieve increase of productivity in the electronic component mounting apparatus equipped with the electronic component feeding apparatus.

According to the fourteenth aspect, the fifteenth aspect, or the sixteenth aspect of the present invention, when the electronic component feeding apparatus is installed in an electronic component mounting apparatus, a control part provided in the electronic component feeding apparatus executes automatic tape sending processing. During execution of the automatic tape sending processing, the control part determines an error in a sending operation of a taping component or a cover tape as a sending failure of the taping component, based on an operation monitoring signal of the sending operation of the taping component or the cover tape inputted by an operation monitoring device, and the control part operates an error reporting device upon determination of the sending failure, which enables an operator to detect occurrence of the sending failure of the taping component without going to an operational portion of the electronic component mounting apparatus.

Therefore, an operator of the electronic component mounting apparatus does not need to go to the operational portion of the electronic component mounting apparatus every time, for example, a taping component needs replacement, but the operator is able to identify whether or not a sending failure of the taping component occurs in the electronic component feeding apparatus, which leads to improvement of workability and an operating ratio of the electronic component mounting apparatus equipped with the electronic component feeding apparatus, thereby implementing increased productivity.

According to the seventeenth aspect and the eighteenth aspect of the present invention, it becomes possible to provide an electronic component feeding apparatus capable of fulfilling an operation monitoring device with relatively inexpensive components, reliably detecting a sending failure of a taping component, and obtaining an effect similar to the effect obtained by the fifteenth aspect or the sixteenth aspect.

It is to be understood that proper combination of arbitrary embodiments among the above-described various embodiments may offer effects included in respective embodiments.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A combination of an electronic component feeding apparatus and taping components of different widths,
   each of said taping components including
      (i) a carrier tape having upper-side recesses for incorporating therein electronic components, and
      (ii) a cover tape attached to said carrier tape for covering said upper-side recesses, and
   said electronic component feeding apparatus comprising:
      (i) a tape sending mechanism for pulling any one of said taping components from a component housing reel on which said any one of said taping components is wound, and sending said any one of said taping components along a transportation route toward a component pickup position;
      (ii) a cover stripping-off mechanism for stripping the cover tape from the carrier tape of said any one of said taping components while traveling along the transportation route; and
      (iii) a cover collecting mechanism for sending said cover tape, after being stripped from said carrier tape, to a collection position so as to collect said cover tape, said cover collecting mechanism including
         (a) a twist transportation mechanism for twisting said cover tape, after being stripped from said carrier tape, such that a face of said cover tape is approximately parallel to a plane that is orthogonal to an axial direction of said component housing reel,
         (b) a rotary member for sending said cover tape to the collection position by being rotated along said cover tape, with a length of said rotary member in its axial direction being greater than the width of one of said taping components that has a maximum width relative to the width of each other of said taping components, and with the axial direction of said rotary member being approximately parallel to a sending direction of said any one of said taping components toward the component pickup position, and
         (c) a drive motor for rotating said rotary member,
   such that electronic components in said upper-side recesses exposed by the stripping of said cover tape from said carrier tape are sequentially fed to the component pickup position.

2. The combination according to claim 1, further comprising:
   a mainframe equipped with said tape sending mechanism and said cover stripping-off mechanism;
   a tape discharge port; and
   a carrier collecting mechanism for leading said carrier tape, after having said cover tape stripped therefrom, to and through said discharge port,
   wherein said cover collecting mechanism is for sending said cover tape, after being stripped from said carrier tape, to a collection position by leading said cover tape to and through said discharge port.

3. The combination according to claim 2, wherein said tape discharge port opens in a vertically downward direction on a lower side of said mainframe.

4. The combination according to claim 1, further comprising:
   a mainframe; and
   a reel support member having a shaft capable of rotatably supporting the component housing reel on which is wound said any one of said taping components, said reel support member being disposed on one end of said mainframe so as to be swingable relative to said mainframe between a support position at a lower portion of said mainframe, at which said reel support member is capable of supporting the component housing reel, and a detachment position at an upper portion of said mainframe, at which the component housing reel can be detached from said reel support member,
   wherein said tape sending mechanism is disposed on another end of said mainframe, and
   wherein said cover stripping-off mechanism is disposed on an upper side of the transportation route between said one end and said another end of said mainframe.

5. The combination according to claim 1, further comprising:
   a cover; and
   a pressing member for pressing said cover, when said electronic feeding apparatus is not installed in an electronic component mounting apparatus, such that said cover covers said upper-side recesses after said cover tape has been stripped from said carrier tape,
   wherein said cover is constructed and arranged to be moved and adjusted, when said electronic feeding apparatus is installed in an electronic component mounting apparatus, by the electronic component mounting apparatus so as to provide an opening that enables pickup of an electronic component from a corresponding one of said upper-side recesses at the component pickup position.

6. The combination according to claim 1, further comprising:
   an operation monitoring device having
      (i) a timer for measuring time required for performing a sending operation of said any one of said taping components, or time required for performing a sending operation of said cover tape, and
      (ii) a lever operation monitoring sensor for monitoring a specified amount of rotation of a tension-imparting lever that is operable to rotate when said cover collecting mechanism sends said cover tape,
   said operation monitoring device for outputting as operation monitoring signals
      (a) the time required as measured by said timer, and
      (b) a signal, as outputted by said lever operation monitoring sensor, indicating execution of the specified amount of rotation of the tension-imparting lever,
   an error reporting device for reporting a sending failure of said any one of said taping components, and a control part
(i) for executing
(a) upon reception of power feed from an electronic component mounting apparatus, when said electronic component feeding apparatus is installed in the electronic component mounting apparatus, automatic tape sending processing by outputting an operation control signal to said tape sending mechanism, said cover stripping-off mechanism, or said cover collecting mechanism so that an electronic component exposed in a corresponding one of said upper-side recesses is positioned at the component pickup position, and
(b) during execution of the automatic tape sending processing, when the signal as outputted by said lever operation monitoring sensor, indicating execution of the specified amount of rotation of the tension-imparting lever, is not outputted within a specified time, error report processing for determining an error in performance of the sending operation of said any one of said taping components, or in performance of the sending operation of said cover tape, as the sending failure, and
(ii) for operating said error reporting device upon determination of the sending failure.

7. A combination of an electronic component feeding apparatus and taping components of different widths,
each of said taping components including
(i) a carrier tape having upper-side recesses for incorporating therein electronic components, and
(ii) a cover tape attached to said carrier tape for covering said upper-side recesses, and
said electronic component feeding apparatus comprising:
(i) a tape sending mechanism for pulling any one of said taping components from a component housing reel on which said any one of said taping components is wound, and sending said any one of said taping components along a transportation route toward a component pickup position, said tape sending mechanism including
(a) a first rotary member for sending said any one of said taping components, along the transportation route toward the component pickup position, by being rotated along said any one of said taping components, and
(b) a brush-less drive motor for rotating said first rotary member,
(ii) a cover stripping-off mechanism for stripping the cover tape from the carrier tape of said any one of said taping components while traveling along the transportation route, and
(iii) a cover collecting mechanism for sending said cover tape, after being stripped from said carrier tape, to a collection position so as to collect said cover tape, said cover collecting mechanism including
(a) a twist transportation mechanism for twisting said cover tape, after being stripped from said carrier tape, such that a face of said cover tape is approximately parallel to a plane that is orthogonal to an axial direction of said component housing reel,
(b) a second rotary member for sending said cover tape to the collection position by being rotated along said cover tape, with a length of said second rotary member in its axial direction being greater than the width of one of said taping components that has a maximum width relative to the width of each other of said taping components, and with the axial direction of said second rotary member being approximately parallel to a sending direction of said any one of said taping components toward the component pickup position, and
(c) a brush-less drive motor for rotating said second rotary member,
such that electronic components in said upper-side recesses exposed by the stripping of said cover tape from said carrier tape are sequentially fed to the component pickup position.

8. The combination according to claim 7, further comprising:
a mainframe equipped with said tape sending mechanism and said cover stripping-off mechanism;
a tape discharge port; and
a carrier collecting mechanism for leading said carrier tape, after having said cover tape stripped therefrom, to and through said discharge port,
wherein said cover collecting mechanism is for sending said cover tape, after being stripped from said carrier tape, to a collection position by leading said cover tape to and through said discharge port.

9. The combination according to claim 7, further comprising:
a mainframe; and
a reel support member having a shaft capable of rotatably supporting the component housing on which is wound said any one of said taping components, said reel support member being disposed on one end of said mainframe so as to be swingable relative to said mainframe between a support position at a lower portion of said mainframe, at which said reel support member is capable of supporting the component housing reel, and a detachment position at an upper portion of said mainframe, at which the component housing reel can be detached from said reel support member,
wherein said tape sending mechanism is disposed on another end of said mainframe, and
wherein said cover stripping-off mechanism is disposed on an upper side of the transportation route between said one end and said another end of said mainframe.

10. The combination according to claim 7, further comprising:
a cover; and
a pressing member for pressing said cover, when said electronic feeding apparatus is not installed in an electronic component mounting apparatus, such that said cover covers said upper-side recesses after said cover tape has been stripped from said carrier tape,
wherein said cover is constructed and arranged to be moved and adjusted, when said electronic feeding apparatus is installed in an electronic component mounting apparatus, by the electronic component mounting apparatus so as to provide an opening that enables pickup of an electronic component from a corresponding one of said upper-side recesses at the component pickup position.

11. The combination according to claim 7, further comprising:
an operation monitoring device having
(i) a timer for measuring time required for performing a sending operation of said any one of said taping components, or time required for performing a sending operation of said cover tape, and (ii) a lever operation monitoring sensor for monitoring a specified amount of rotation of a tension-imparting lever that is operable to rotate when said cover collecting mechanism sends said cover tape, said operation monitoring device for outputting as operation monitoring signals
   (a) the time required as measured by said timer, and
   (b) a signal, as outputted by said lever operation monitoring sensor, indicating execution of the specified amount of rotation of the tension-imparting lever, an error reporting device for reporting a sending failure of said any one of said taping components; and a control part
   (i) for executing
      (a) upon reception of power feed from an electronic component mounting apparatus, when said electronic component feeding apparatus is installed in the electronic component mounting apparatus, automatic tape sending processing by outputting an operation control signal to said tape sending mechanism, said cover stripping-off mechanism, or said cover collecting mechanism so that an electronic component exposed in a corresponding one of said upper-side recesses is positioned at the component pickup position, and
      (b) during execution of the automatic tape sending processing, when the signal as outputted by said lever operation monitoring sensor, indicating execution of the specified amount of rotation of the tension-imparting lever, is not outputted within a specified time, error report processing for determining an error in performance of the sending operation of said any one of said taping components, or in performance of the sending operation of said cover tape, as the sending failure, and
   (ii) for operating said error reporting device upon determination of the sending failure.

12. An electronic component feeding apparatus to be installed in an electronic component mounting apparatus, comprising:

a tape sending mechanism for pulling a taping component and sending the taping component along a transportation route toward a component pickup position, with the taping component including
   (i) a carrier tape having upper-side recesses for incorporating therein electronic components, and
   (ii) a cover tape attached to the carrier tape for covering the upper-side recesses, a cover stripping-off mechanism for stripping the cover tape from the carrier tape of the taping component while traveling along the transportation route such that electronic components in the upper-side recesses, exposed by the stripping of the cover tape from the carrier tape, are sequentially fed to the component pickup position, a cover, and a pressing member for pressing said cover, when said electronic feeding apparatus is not installed in the electronic component mounting apparatus, such that said cover covers the upper-side recesses after the cover tape has been stripped from the carrier tape, wherein said cover is constructed and arranged to be moved and adjusted, when said electronic feeding apparatus is installed in the electronic component mounting apparatus, by the electronic component mounting apparatus so as to provide an opening that enables pickup of an electronic component from a corresponding one of the upper-side recesses at the component pickup position.

13. An electronic component feeding apparatus comprising:

a tape sending mechanism for pulling a taping component and sending the taping component along a transportation route toward a component pickup position, with the taping component including
   (i) a carrier tape having upper-side recesses for incorporating therein electronic components, and
   (ii) a cover tape attached to the carrier tape for covering the upper-side recesses, a cover stripping-off mechanism for stripping the cover tape from the carrier tape of the taping component while traveling along the transportation route such that electronic components in the upper-side recesses, exposed by the stripping of the cover tape from the carrier tape, are sequentially fed to the component pickup position, a cover collecting mechanism for sending the cover tape, after being stripped from the carrier tape, in a collectable manner to a collection position, and an operation monitoring device having
   (i) a timer for measuring time required for performing a sending operation of the taping component, or time required for performing a sending operation of the cover tape, and
   (ii) a lever operation monitoring sensor for monitoring a specified amount of rotation of a tension-imparting lever that is operable to rotate when said cover collecting mechanism sends the cover tape, said operation monitoring device for outputting as operation monitoring signals
   (a) the time required as measured by said timer, and
   (b) a signal, as outputted by said lever operation monitoring sensor, indicating execution of the specified amount of rotation of the tension-imparting lever, an error reporting device for reporting a sending failure of the taping component; and a control part
   (i) for executing
      (a) upon reception of power feed from an electronic component mounting apparatus, when said electronic component feeding apparatus is installed in the electronic component mounting apparatus, automatic tape sending processing by outputting an operation control signal to said tape sending mechanism, said cover stripping-off mechanism, or said cover collecting mechanism so that an electronic component exposed in a corresponding one of the upper-side recesses is positioned at the component pickup position, and
      (b) during execution of the automatic tape sending processing, when the signal as outputted by said lever operation monitoring sensor, indicating execution of the specified amount of rotation of the tension-imparting lever, is not outputted within a specified time, error report processing for determining an error in performance of the sending operation of the taping component, or in performance of the sending operation of the cover tape, as the sending failure, and (ii) for operating said error reporting device upon determination of the sending failure.

14. A method for feeding electronic components, comprising:

providing taping components of different widths, with each of said taping components including
  (i) a carrier tape having upper-side recesses for incorporating therein electronic components, and
  (ii) a cover tape attached to said carrier tape for covering said upper-side recesses;

using a tape sending mechanism to pull any one of said taping components from a component housing reel, on which said any one of said taping components is wound, and sending said any one of said taping components along a transportation route toward a component pickup position;

using a cover stripping-off mechanism to strip the cover tape from the carrier tape of said any one of said taping components while traveling along said transportation route; and using a cover collecting mechanism to send said cover tape, after being stripped from said carrier tape, to a collection position so as to collect said cover tape, wherein using said cover collecting mechanism to send said cover tape to said collection position includes
  (a) using a twist transportation mechanism to twist said cover tape, after being stripped from said carrier tape, such that a face of said cover tape is approximately parallel to a plane that is orthogonal to an axial direction of said component housing reel, and
  (b) using a rotary member to send said cover tape to said collection position by being rotated via a drive motor along said cover tape, with a length of said rotary member in its axial direction being greater than the width of one of said taping components that has a maximum width relative to the width of each other of said taping components, and with the axial direction of said rotary member being approximately parallel to a sending direction of said any one of said taping components toward said component pickup position, such that electronic components in said upper-side recesses exposed by the stripping of said cover tape from said carrier tape are sequentially fed to said component pickup position.

15. A method for feeding electronic components, comprising:

providing taping components of different widths, with each of said taping components including
  (i) a carrier tape having upper-side recesses for incorporating therein electronic components, and
  (ii) a cover tape attached to said carrier tape for covering said upper-side recesses;

using a tape sending mechanism to pull any one of said taping components from a component housing reel, on which said any one of said taping components is wound, and sending said any one of said taping components along a transportation route toward a component pickup position by rotating a first rotary member, via a brush-less drive motor, along said any one of said taping components;

using a cover stripping-off mechanism to strip the cover tape from the carrier tape of said any one of said taping components while traveling along said transportation route; and using a cover collecting mechanism to send said cover tape, after being stripped from said carrier tape, to a collection position so as to collect said cover tape, wherein using said cover collecting mechanism to send said cover tape to said collection position includes
  (a) using a twist transportation mechanism to twist said cover tape, after being stripped from said carrier tape, such that a face of said cover tape is approximately parallel to a plane that is orthogonal to an axial direction of said component housing reel, and
  (b) using a second rotary member to send said cover tape to said collection position by being rotated via a brush-less drive motor along said cover tape, with a length of said second rotary member in its axial direction being greater than the width of one of said taping components that has a maximum width relative to the width of each other of said taping components, and with the axial direction of said second rotary member being approximately parallel to a sending direction of said any one of said taping components toward said component pickup position, such that electronic components in said upper-side recesses exposed by the stripping of said cover tape from said carrier tape are sequentially fed to said component pickup position.

* * * * *

UNITED STATES PATENT AND TRADEMARK OFFICE
CERTIFICATE OF CORRECTION

PATENT NO. : 6,926,797 B2
DATED : August 9, 2005
INVENTOR(S) : Koji Okawa et al.

It is certified that error appears in the above-identified patent and that said Letters Patent is hereby corrected as shown below:

Title page,
Item [30], Foreign Application Priority Data, change "2000-278190" to -- 2001-278190 --.

Column 32,
Line 64, change "lever," to -- lever; --.
Line 66, change "components," to -- components; --.

Column 33,
Line 48, change "member," to -- member; --.
Line 52, change "route," to -- route; --.

Column 35,
Line 11, change "lever," to -- lever; --.
Line 50, change "recesses," to -- recesses; --.
Line 57, change "position," to -- position; --.
Line 58, change "cover," to -- cover; --.

Column 36,
Line 15, change "recesses," to -- recesses; --.
Lines 22 and 25, change "position," to -- position; --.

Signed and Sealed this

Seventh Day of February, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,926,797 B2 | Page 1 of 1 |
| APPLICATION NO. | : 10/380707 | |
| DATED | : August 9, 2005 | |
| INVENTOR(S) | : Koji Okawa et al. | |

It is certified that error appears in the above-identified patent and that said Letters Patent is hereby corrected as shown below:

IN THE CLAIMS

Column 36, Claim 13, line 41, change "lever," to --lever;--.

Signed and Sealed this

Fourth Day of September, 2007

JON W. DUDAS
*Director of the United States Patent and Trademark Office*